United States Patent [19]
Subramanian et al.

[11] Patent Number: 5,481,126
[45] Date of Patent: Jan. 2, 1996

[54] SEMICONDUCTOR-ON-INSULATOR ELECTRONIC DEVICES HAVING TRENCH ISOLATED MONOCRYSTALLINE ACTIVE REGIONS

[75] Inventors: Chitra K. Subramanian, Austin, Tex.; Gerold W. Neudeck, West Lafayette, Ind.

[73] Assignee: Purdue Research Foundation, West Lafayette, Ind.

[21] Appl. No.: 313,893

[22] Filed: Sep. 27, 1994

[51] Int. Cl.$^6$ .......................... H01L 29/80; H01L 31/112
[52] U.S. Cl. .......................... 257/273; 257/274; 257/276
[58] Field of Search ................................... 257/273, 274, 257/276

[56] References Cited

U.S. PATENT DOCUMENTS

| | | |
|---|---|---|
| 4,504,332 | 3/1985 | Shinada . |
| 4,829,016 | 5/1989 | Neudeck . |
| 4,974,045 | 11/1990 | Okita . |
| 5,049,513 | 9/1991 | Eklund . |
| 5,118,634 | 6/1992 | Neudeck et al. . |
| 5,177,582 | 1/1993 | Meister et al. . |
| 5,212,397 | 5/1993 | See et al. . |
| 5,258,318 | 11/1993 | Buti et al. . |
| 5,279,978 | 1/1994 | See et al. . |
| 5,286,996 | 2/1994 | Neudeck et al. . |

FOREIGN PATENT DOCUMENTS 0588300  3/1994  European Pat. Off. .

OTHER PUBLICATIONS

Konaka et al., *A 20–ps Si Bipolar IC Using Advanced Super Self–Aligned Process Technology with Collector Ion Implantation*, IEEE Transactions on Electron Devices, vol. 36, No. 7, Jul. 1989, pp. 1370–1375.

J. van der Velden et al., *Basic: An Advanced High–Performance Bipolar Process*, IEEE, IEDM 89, pp. 233–236.

Wen Feng, *Accurate Analytical Delay Expressions for ECL and CML Circuits and Their Applications to Optimizing High–Speed Bipolar Circuits*, IEEE Journal of Solid–State Circuits, vol. 25, No. 2, Apr. 1990, pp. 572–583.

Subramanian et al., *Large Area Silicon on Insulator by Double–Merged Epitaxial Lateral Overgrowth*, J. Vac. Sci. Technol. B., vol. 10, No. 2, Mar./Apr. 1992, pp. 643–647.

Subramanian et al., *SOI Processing by Epitaxial Lateral Overgrowth*, IEEE, 1991, pp. 132–133.

Subramanian et al., *A Full–Wafer SOI Process for 3 Dimensioanl Integration*, IEEE, 1991, pp. 195–198.

Glenn, Jr. et al., *A fully Planar Method for Creating Adjacent "Self–Isolating" Silicon–On–Insulator and Epitaxial Layers by Epitaxial Lateral Overgrowth*, Appl. Phys. Lett., vol. 60, No. 4, Jan. 27, 1992, pp. 483–485.

Bashir et al., *A Polysilicon Contacted Subcollector BJT for a Three–Dimensional BiCMOS Process*, IEEE Electron Device LEtters, vol. 13, No. 8, Aug. 1992, pp. 392–395.

Bashir et al., *Delay Time Studies and Electron Mobility Measurement in an α–Si:H TFT*, IEEE Transaction on Electron Devices, vol. 36, No. 12, Dec. 1989, pp. 2944–2948.

*A Technique to Measure the Dynamic Response of α–Si:H*

(List continued on next page.)

Primary Examiner—Stephen D. Meier
Attorney, Agent, or Firm—Bell, Seltzer, Park & Gibson

[57] ABSTRACT

A semiconductor-on-insulator (SOI) electronic device includes a monocrystalline semiconductor substrate and at least one trench therein. A trench insulating layer is provided on a bottom the trench for electrical isolation and a monocrystalline semiconducting region is also included in the trench, on the trench insulating layer. The semiconducting region preferably includes epitaxially overgrown silicon (EOS) which is grown from an exposed sidewall of the trench. An active region of the electronic device is also included in the semiconductor layer. Second, third, and additional active regions of the electronic device, if any, may also be included in the semiconducting region or in additional semiconducting regions which are provided in additional trenches. The semiconductor substrate may also include one or more active regions of the electronic device.

27 Claims, 16 Drawing Sheets

OTHER PUBLICATIONS

Thin Film Transistor Circuits, Solid–State Electronics, vol. 33, No. 7, 1990, pp. 973–974.

Gilbert et al., *A Fully Integrable INsulated Gate Bipolar Transistor with a Trench Gate Structure,* 5th International Symposium on Power Semiconductor Devices and IC's, 1993, pp. 240–245.

Yen et al., *Microstructural Examinatiaon of Extended Crystal Defects in Silicon Selective Epitaxial Growth,* Journal of Electronic Materials, vol. 22, No. 11, 1993, pp. 1331–1339.

Bashir et al., *A Novel Three Dimensional BICMOS Process Using Epitaxial Lateral Overgrowth of Silocon,* IEEE 1991 Custom Integrated Circuits Conference, pp. 18.2.1–18.2.4.

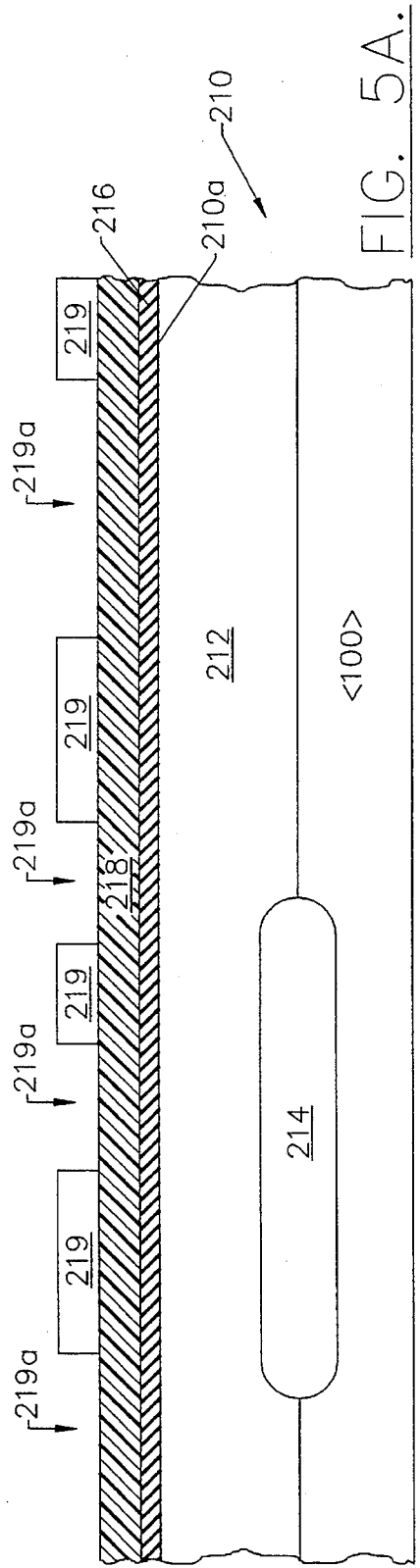
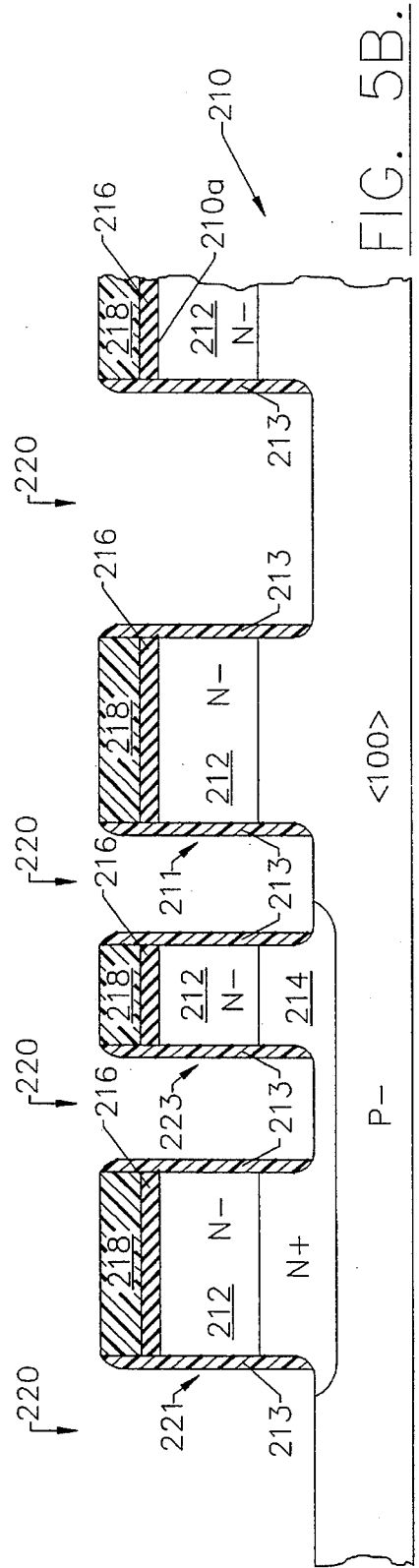

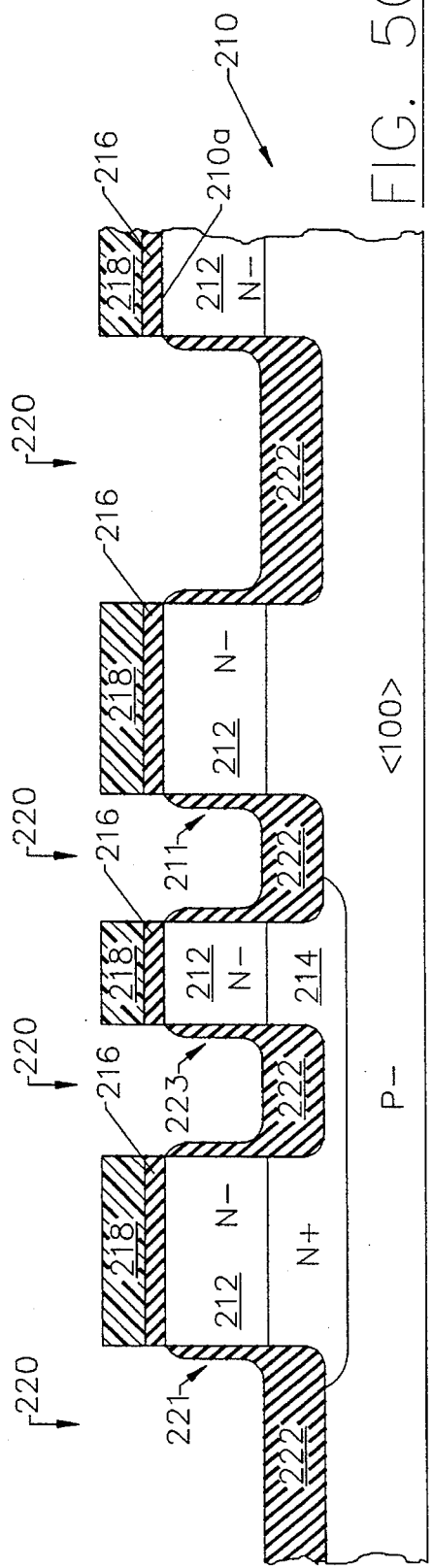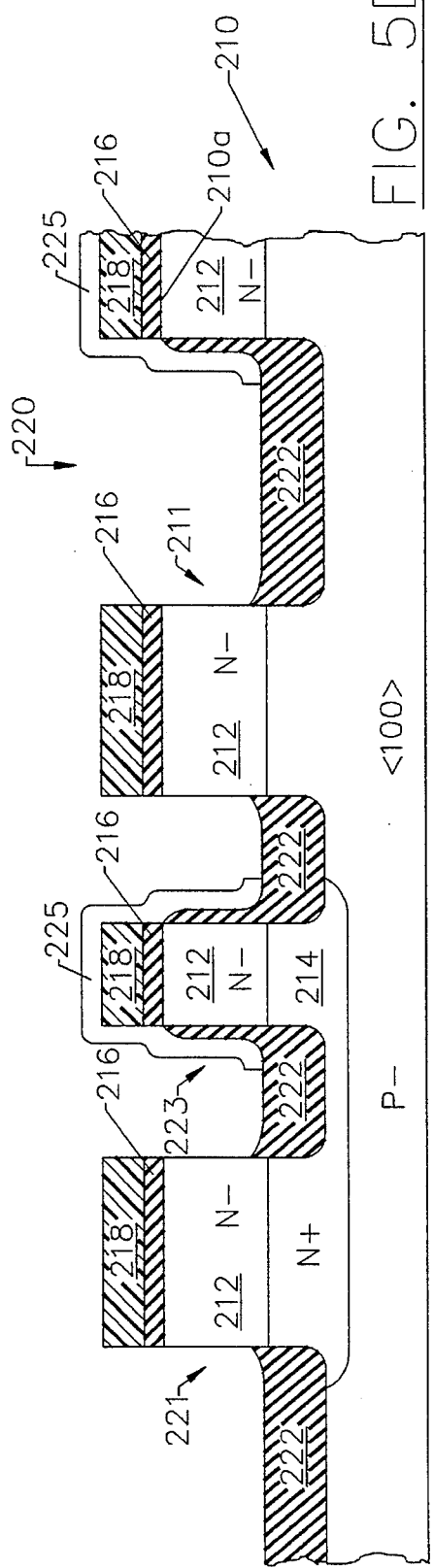

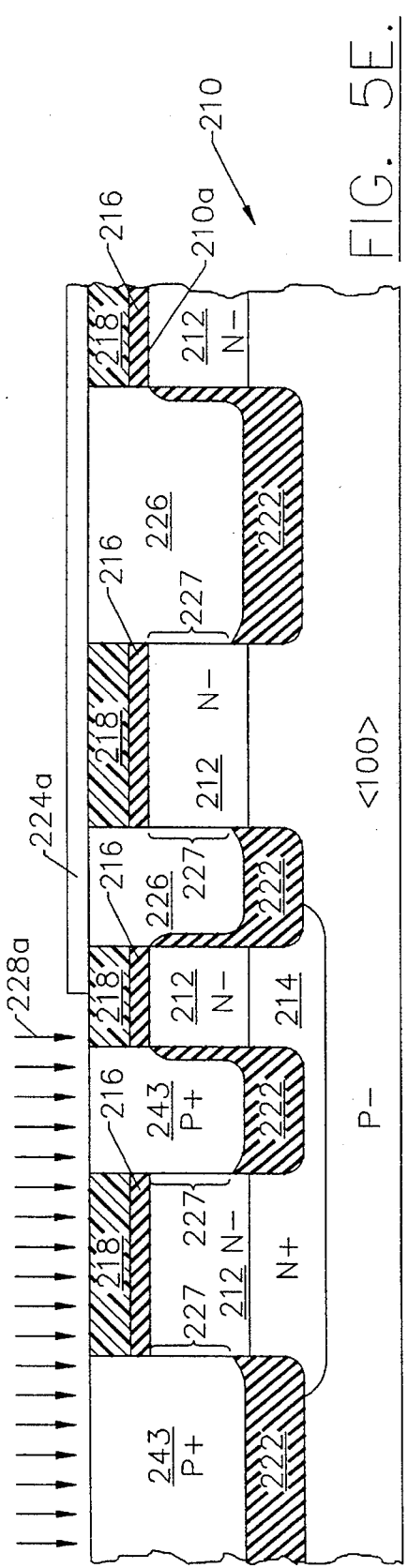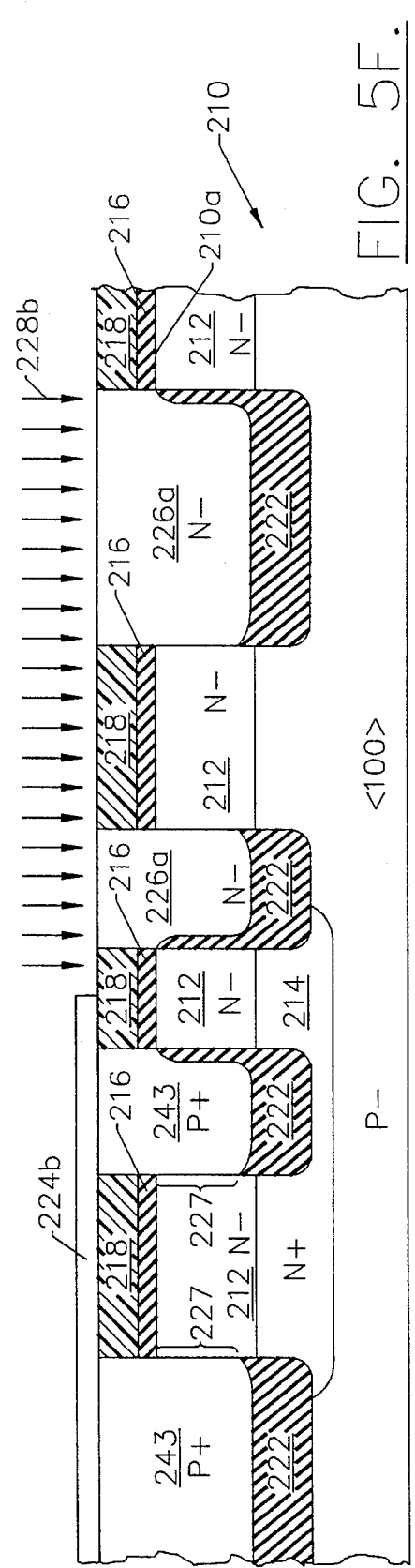

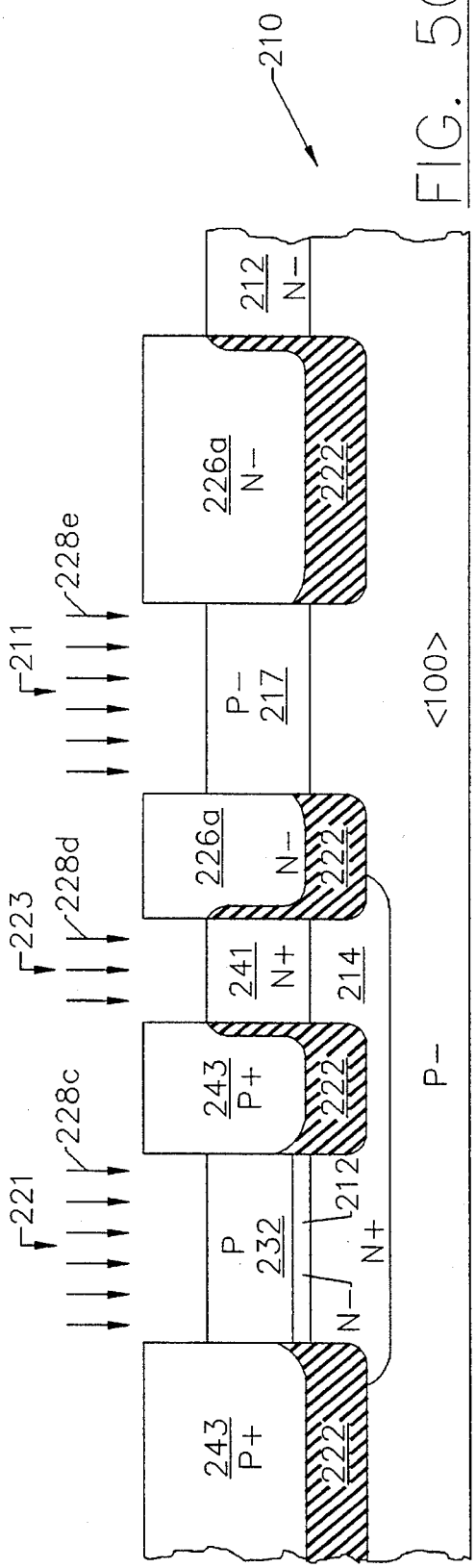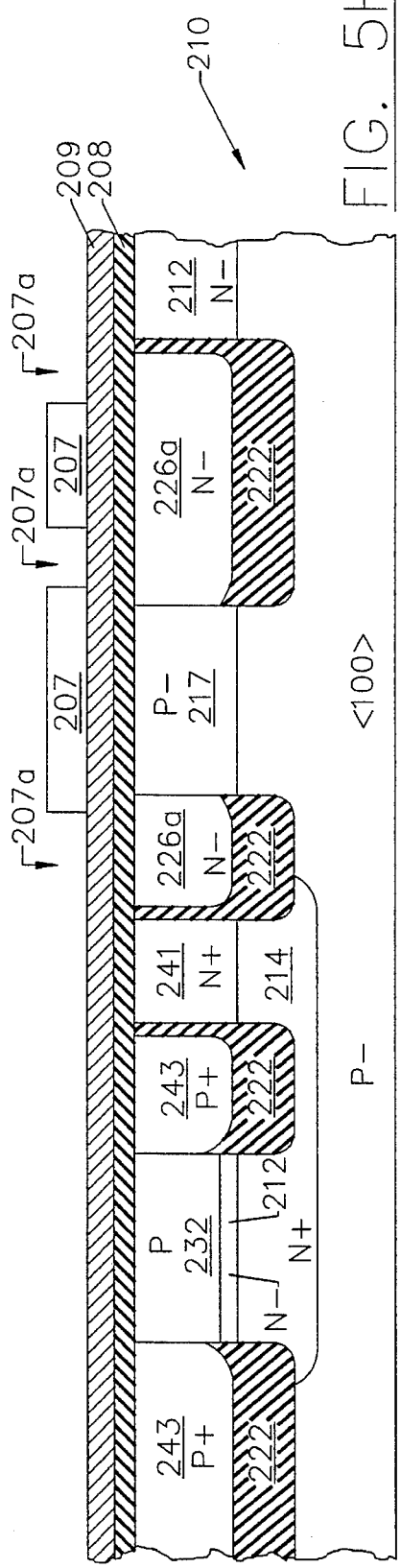

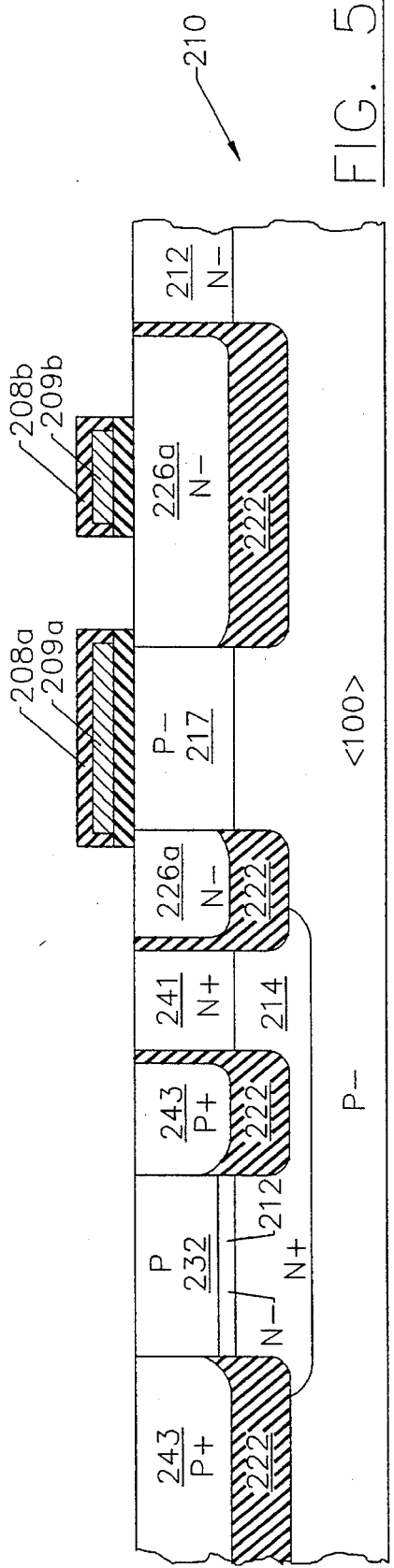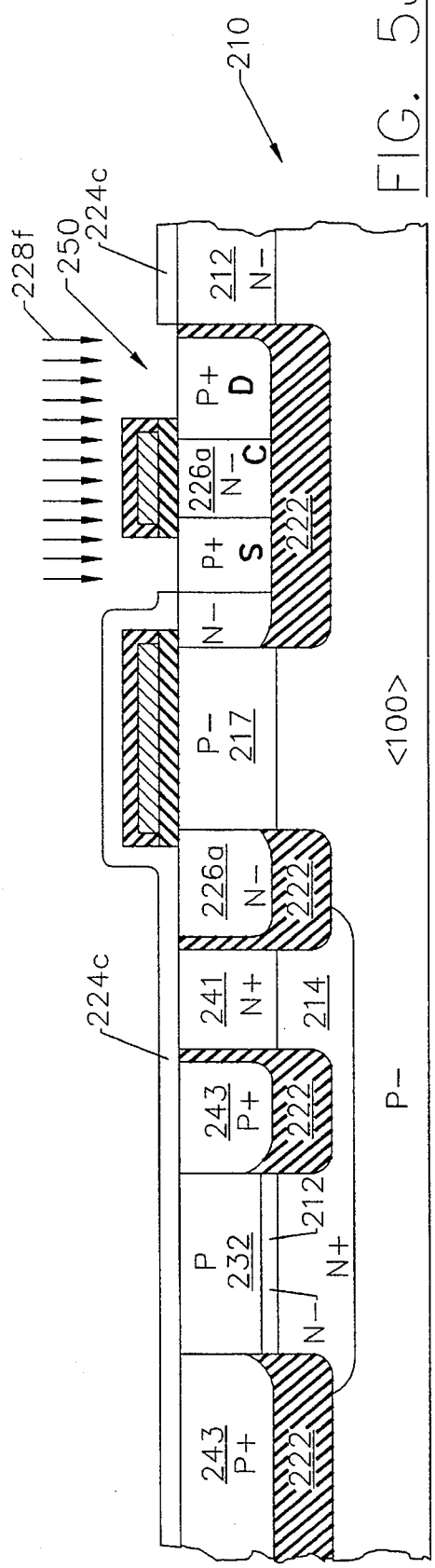

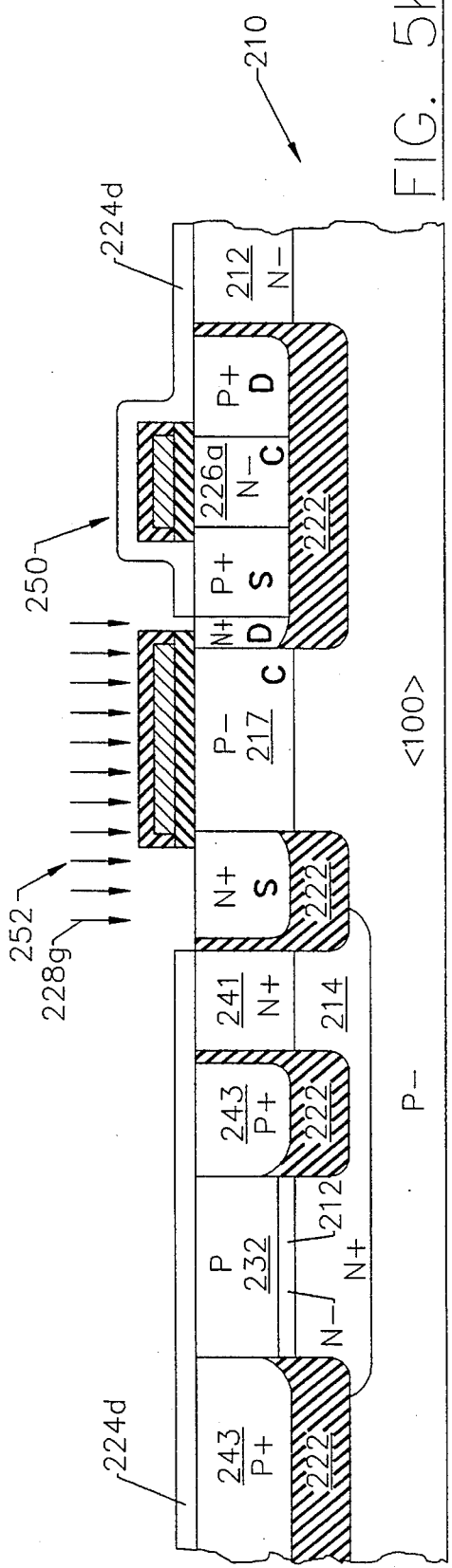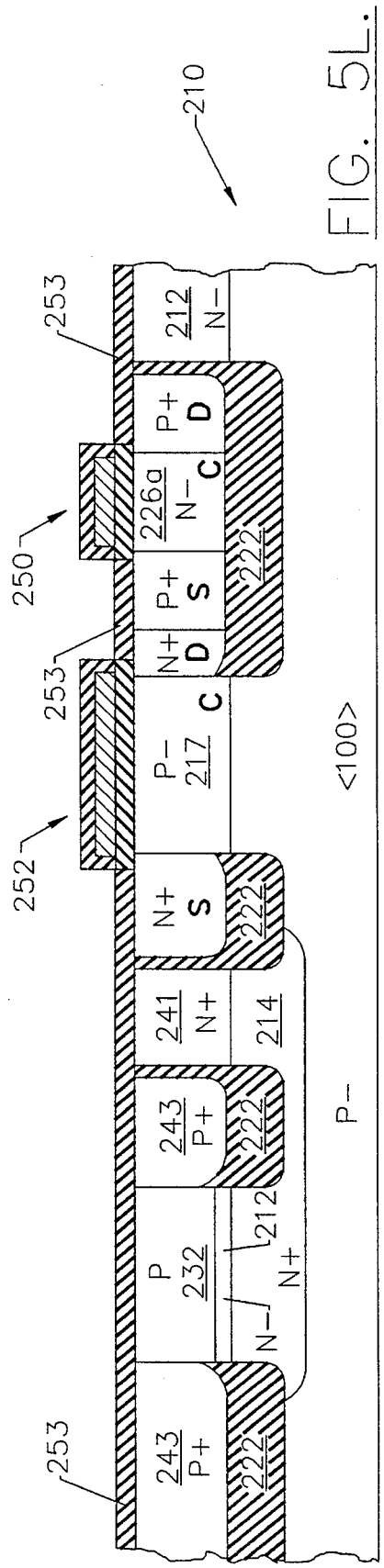

SEMICONDUCTOR-ON-INSULATOR ELECTRONIC DEVICES HAVING TRENCH ISOLATED MONOCRYSTALLINE ACTIVE REGIONS

CROSS-REFERENCE TO RELATED APPLICATION

This application is related to Application Ser. No. 08/312,874, entitled METHOD OF FORMING SEMICONDUCTOR-ON-INSULATOR ELECTRONIC DEVICES BY GROWING MONOCRYSTALLINE SEMICONDUCTING REGIONS FROM TRENCH SIDEWALLS (Attorney Docket No. 5347-111), filed concurrently herewith.

FIELD OF THE INVENTION

The present invention relates to semiconductor electronic devices, and more particularly semiconductor-on-insulator electronic devices.

BACKGROUND OF THE INVENTION

Semiconductor electronic devices may be formed on silicon-on-insulator (SOI) substrates with reduced parasitic and nodal capacitances, increased radiation hardness and reduced process complexity compared to bulk semiconductor devices. In particular, electronic devices such as SOI field effect transistors (FETs) typically have lower source/drain-to-substrate capacitance and higher latch-up immunity compared to their bulk counterparts. However, floating body effects caused by the presence of a continuous insulating layer may limit performance of conventional SOI FETs. Lower source-drain breakdown voltage caused by parasitic bipolar action also limits performance of conventional SOI FETs.

Electronic devices such as bipolar junction transistors (BJTs) may also benefit from being formed in monocrystalline SOI substrates, particularly when the extrinsic base and extrinsic collector contact regions are monocrystalline as well. Presently, the most popular commercial high-speed BJT structure is the Super Self-Aligned Transistor (SST) of FIG. 1. This BJT is typically characterized by a relatively low emitter-base capacitance ($C_{eb}$), but a relatively high base-collector capacitance ($C_{bc}$). Double Self-Aligned Transistors (DSTs) such as the Sidewall Contacted Structure (SICOS) of FIG. 2 typically have lower $C_{bc}$, however these devices employ a polycrystalline extrinsic base contact region. To compensate for this, the edges of the base-collector junction are moved away from the polycrystalline extrinsic base contact region to prevent the depletion region in the intrinsic base from contacting the extrinsic base contact region during operation. For example, an extrinsic-to-intrinsic base link-up region is typically used adjacent the intrinsic collector region to provide the necessary separation, as illustrated by FIG. 2. This results in an increase in the base-collector junction area and prevents even smaller $C_{bc}$ from being achieved with DST devices.

Electronic devices which include a combination of Complimentary Metal-Oxide-Semiconductor (CMOS) FETs and BJTs (e.g., BiCMOS) can also be expected to achieve higher performance characteristics when formed on SOI substrates, particularly when all the active regions of the devices are monocrystalline and floating body effects have been eliminated. Attempts have been made to form BiCMOS devices on SOI substrates. For example, U.S. Pat. No. 5,049,513 to Eklund discloses a method of fabricating a BJT and a FET transistor on an SOI substrate. U.S. Pat. No. 5,212,397 to See et al. and U.S. Pat. No. 5,258,318 to Buti et al. also disclose BiCMOS devices and methods of forming the same on SOI substrates.

Notwithstanding these attempts to incorporate BJT and FET electronic devices on SOI substrates, there still exists a need for improved electronic devices such as FETs, BJTs and BiCMOS devices on SOI substrates, and methods of forming same, which have monocrystalline active regions, lower parasitic capacitances and reduced susceptibility to floating body effects and parasitic latch-up.

SUMMARY OF THE INVENTION

It is therefore an object of the present invention to provide a semiconductor-on-insulator electronic device having monocrystalline active regions therein.

It is another object of the present invention to provide a semiconductor-on-insulator electronic device having trench isolated active regions.

It is a further object of the present invention to provide a semiconductor-on-insulator electronic device having reduced susceptibility to floating body effects, parasitic bipolar action and parasitic thyristor latch-up.

It is still a further object of the present invention to provide an improved BiCMOS cell.

These and other objects, features and advantages of the present invention are provided by an electronic device which has a plurality of trench isolated monocrystalline active regions. Trench isolation is preferably achieved by including electrically insulating layers at the bottoms of a plurality of trenches and including monocrystalline semiconducting regions on the insulating layers. The active regions of the electronic device are then formed in the semiconducting regions. The semiconducting regions are preferably grown from sidewalls of each trench using an epitaxial lateral overgrowth (ELO) technique. In particular, the semiconducting regions preferably comprise an epitaxially overgrown semiconductor, such as epitaxially overgrown silicon (EOS).

One embodiment of the present invention is a semiconductor-on-insulator (SOI) electronic device such as a bipolar junction transistor (BJT) or field effect transistor (FET) having at least one monocrystalline active region which is in a trench and is also electrically isolated from an adjacent semiconductor substrate by a trench insulating layer on a bottom of the trench. For example, a bipolar junction transistor according to the present invention includes an epitaxially overgrown extrinsic base region in a trench, and an intrinsic base region, an intrinsic collector region and an emitter region adjacent a sidewall of the trench. A field effect transistor according to the present invention includes an epitaxially overgrown source region and an epitaxially overgrown drain region in one or more adjacent trenches.

A semiconductor electronic device according to another embodiment of the present invention includes a BiCMOS cell, wherein epitaxially overgrown monocrystalline active regions of the cell are formed in adjacent trenches having electrically insulating layers along the bottoms thereof. In particular, the bipolar junction transistor (BJT) of the BiCMOS cell includes a completely monocrystalline extrinsic base region. This region eliminates the need for complex intrinsic-to-extrinsic link-up regions adjacent the base-collector junction, and this helps to minimize the base-collector junction area and capacitance. In addition, the PMOS transistor of the cell is an SOI device having an insulating layer extending between the active regions of the device and the semiconductor substrate. However, the NMOS transistor of the cell is preferably a partial-SOI device which combines the lowered device parasitic advantage of SOI with the ability to electrically connect a neutral NMOS substrate (channel region) to a fixed potential. This eliminates the hot-electron induced parasitic bipolar action associated with conventional SOI devices, but preserves the latch-up immunity of these devices.

BRIEF DESCRIPTION OF THE DRAWINGS

FIGS. 5A–5M are schematic cross-sectional views of intermediate structures illustrating a method of forming an electronic device fabricated according to a third embodiment of the present invention.

DESCRIPTION OF A PREFERRED EMBODIMENT

The present invention will now be described more fully hereinafter with reference to the accompanying drawings, in which preferred embodiments of a method of forming semiconductor-on-insulator (SOI) electronic devices and electronic devices formed therefrom are illustrated. This invention may, however, be embodied in different forms and should not be construed as limited to only the embodiments set forth herein. Rather, these embodiments are provided so that this disclosure will be thorough and complete, and will fully convey the scope of the invention to those skilled in the art. Like numbers refer to like elements throughout. For greater clarity, the thickness of the illustrated layers and regions have been exaggerated.

Referring now to FIGS. 3A–3L, a method of forming an electronic device according to a first embodiment of the present invention is illustrated. In particular, FIGS. 3A–3L illustrate the steps of forming a preferred SOI NMOS transistor having SOI monocrystalline source and drain regions and a substrate-connected channel region. This transistor has the benefits of conventional SOI FETs such as low source/drain-to-substrate capacitance, latch-up immunity and dielectric isolation which allows for higher integration densities. However, this embodiment does not suffer from floating body effects or low source-drain breakdown voltage caused by parasitic bipolar action, which are commonly associated with conventional SOI devices.

Figure 3A:
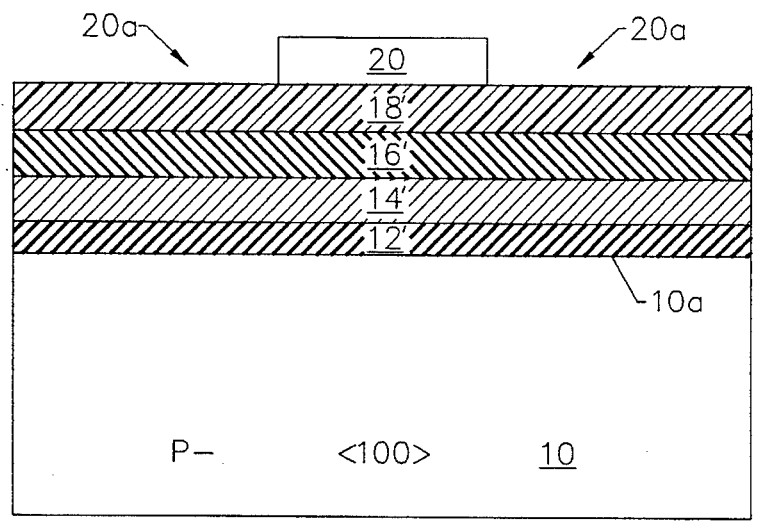
FIGS. 3A–3L are schematic cross-sectional views of intermediate structures illustrating a method of forming an electronic device fabricated according to a first embodiment of the present invention.

Referring specifically to FIG. 3A, an exemplary <100> oriented monocrystalline silicon substrate 10 (shown as P-) is illustrated having a plurality of layers 12'–18' thereon. The method according to this embodiment begins with the step of forming a first insulating layer 12' on a face 10a of the silicon substrate 10. The first insulating layer 12' may be silicon dioxide ($SiO_2$) or another dielectric having similar characteristics. The thickness of the first insulating layer 12' is preferably in the range of about 15 to 50 Å and can be formed using conventional deposition or dry oxidation techniques. Thereafter, an electrically conductive layer 14', such as a relatively thick polycrystalline silicon layer (poly-Si) (or another conductive layer such as a silicide or salacide), is formed on the first insulating layer 12'. As understood by those skilled in the art, a poly-Si layer having a thickness of about 3500 Å may be deposited using Low Pressure Chemical Vapor Deposition (LPCVD).

Next, a second insulating layer 16' is formed on the conductive layer 14'. The second insulating layer 16' is also preferably $SiO_2$ or a similar dielectric. For example, the second insulating layer 16' can be formed by growing a relatively thick wet $SiO_2$ of about 2000 Å from the conductive layer 14'. The second insulating layer forming step is then followed by the step of forming a reactive-ion-etch resistant (RIE-resistant) layer 18', such as silicon nitride ($Si_3N_4$) having a thickness of about 1000 Å, on the second insulating layer 16'. This layer 18' can be deposited by LPCVD as well. A first masking layer such as photoresist, having a thickness in the range of about 1,000 to 10,000 Å, may also be formed and patterned, as illustrated, using techniques well known to those skilled in the art.

Figure 3B:
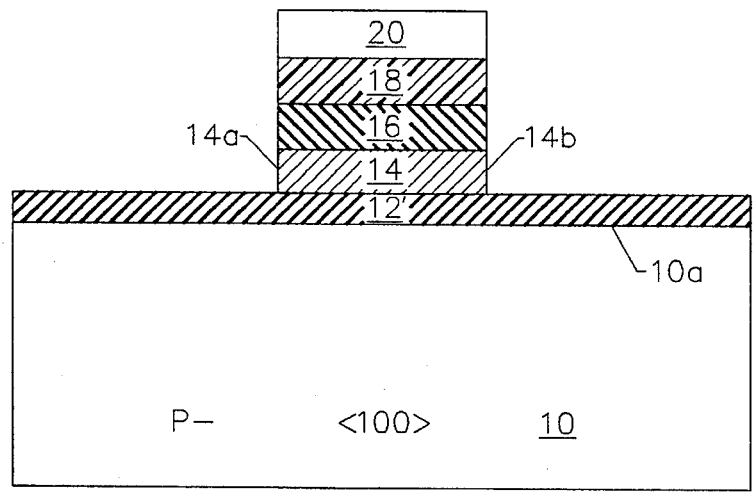
Figure 3C:
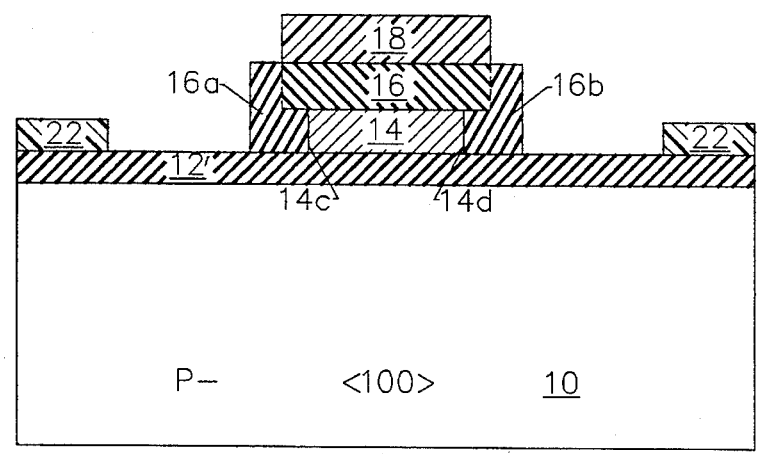
Figure 3D:
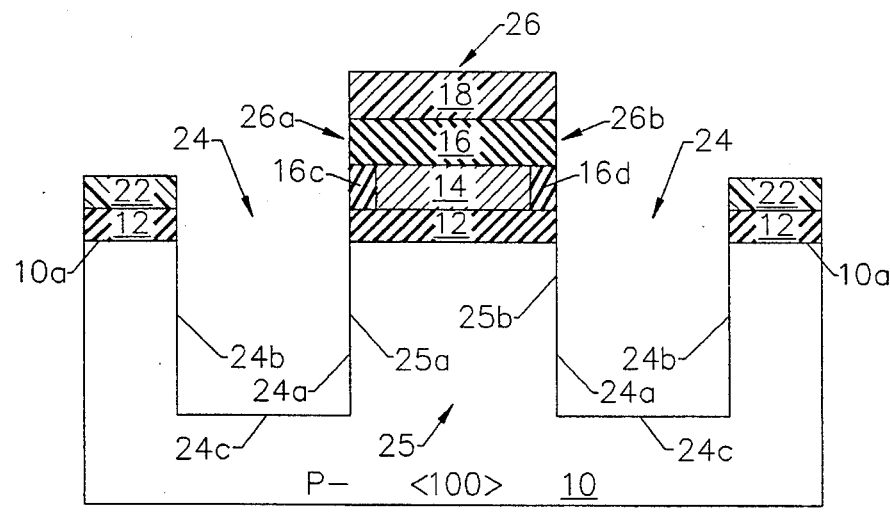

Referring now to FIG. 3B, the conductive layer 14', second insulating layer 16' and the RIE-resistant layer 18' of FIG. 3A are then chemically etched in the exposed areas 20a. This step defines a gate electrode layer 14 having first and second ends 14l–b, a second gate insulating layer 16 and a first RIE-resistant mask layer 18. As illustrated by FIG. 3C, the masking layer 20 is removed and then electrically insulating spacers 16a–b are formed on the first and second ends 14a–b of the gate electrode layer 14. Preferably, the insulating spacers 16a–b are $SiO_2$ having a thickness of about 2000 Å. As understood by those skilled in the art, the insulating spacers can be formed by oxidizing the first and second ends 14a–b of a poly-Si gate electrode layer 14. This oxidizing step also defines the actual length of the gate electrode since part of the gate electrode layer is consumed during oxidation. Accordingly, the actual length of the gate electrode 14 is defined by new ends 14c–d. A second RIE-resistant mask layer 22 such as $Si_3N_4$ is then lithographically patterned on the first insulating layer 12', as illustrated.

A blanket reactive ion etching step using Freon 115 is then preferably performed to selectively etch $SiO_2$ and Si anisotropically, using the first and second RIE-resistant layers 18 and 22 as etch masks. This etching step forms an insulated gate electrode 26 on a mesa 25 which has exposed vertical sidewalls 25a–b. The mesa 25 is preferably of stripe or similar geometry. The RIE etching step also defines adjacent trenches 24, each of which has opposing vertical sidewalls 24a–b in the silicon substrate 10. The $SiO_2$ insulating spacers 16a–b are also partially etched, but the gate electrode 14 still remains insulated by thinner insulating spacers 16c–d.

Figure 3E:
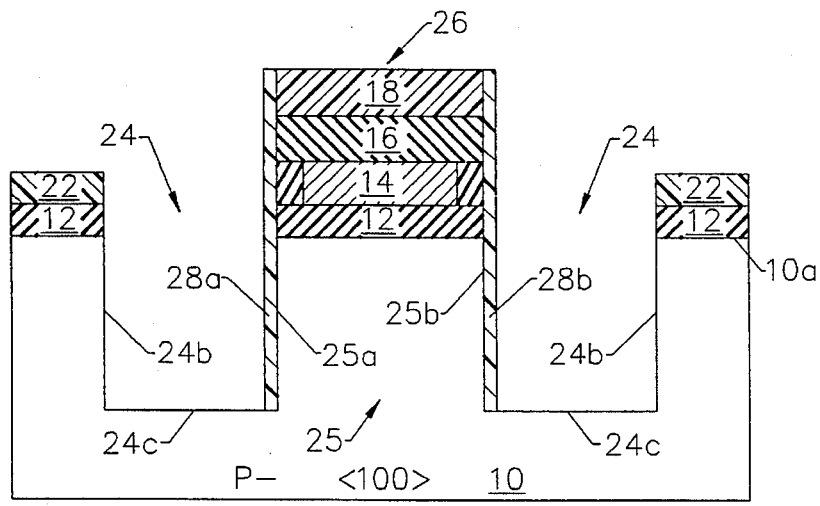
Figure 3F:
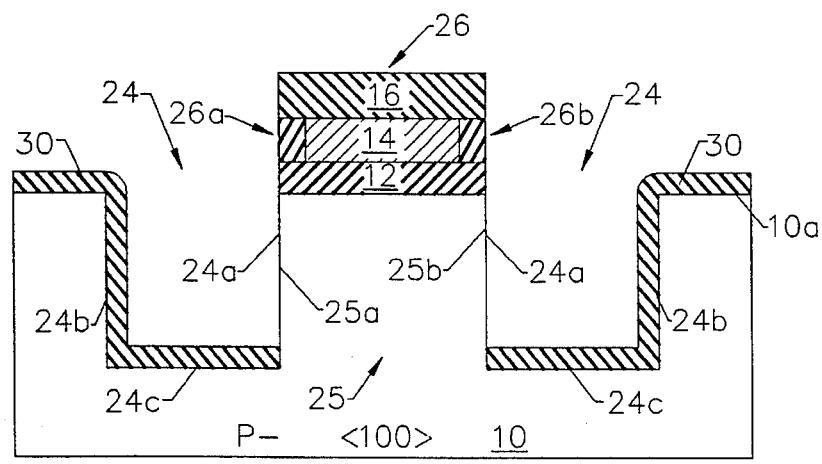

Referring now to FIGS. 3E–3F, additional spacers 28a–b are also formed adjacent the sidewalls 26a–b of the insulated gate electrode 26 and adjacent the sidewalls 25a–b of the mesa 25. This spacer forming step is performed so that relatively thick trench insulating layers can be selectively formed adjacent the trench bottoms 24c and adjacent the outside sidewalls 24b, but not on the mesa sidewalls 25a–b. These spacers 28a–b are preferably $Si_3N_4$ spacers which have a sufficient thickness of about 1000 Å to inhibit $SiO_2$ growth adjacent the mesa sidewalls 25a–b. Trench insulating layers 30 are then formed on the trench bottoms 24c and sidewalls 24b by performing a wet oxidation of the structure of FIG. 3E and then removing the nitride spacers 28a–b and the first and second RIE-resistant layers 18 and 22, preferably with phosphoric acid. As illustrated, the trench insulating layers 30 ultimately extend along the outside trench sidewalls 24b, on the trench bottoms 24c and on lowermost portions of the mesa sidewalls 25a–b (i.e., inner trench sidewalls 24a), however, the insulating layers 30 do not extend adjacent uppermost portions of the mesa sidewalls 25a–b (24a).

Figure 3G:
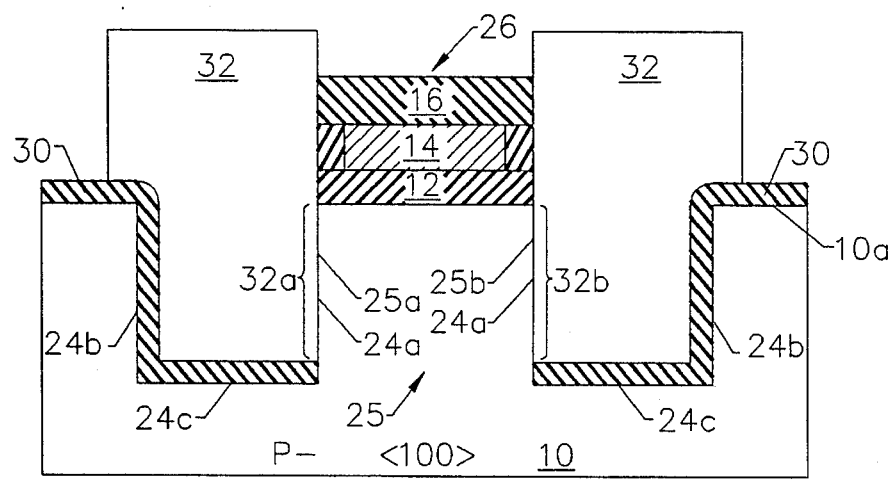
Figure 3H:
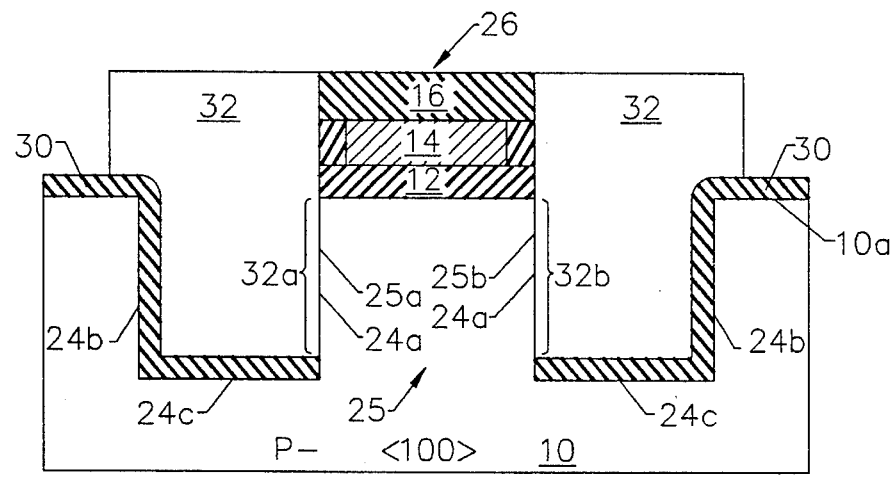

Referring now to FIGS. 3G–3H, monocrystalline semiconducting regions 32 are then formed from the uppermost (i.e., exposed) portions of the mesa sidewalls 25a–b onto the trench insulating layers 30. Preferably, this step includes the step of growing monocrystalline silicon from the vertical seed windows 32a–b using vertically-seeded epitaxial lateral overgrowth (VELO). This can be done by placing the structure of FIG. 3F in a LPCVD epi growth reactor (not shown) and then growing monocrystalline epitaxial silicon from the windows 32a–b. The monocrystalline silicon semiconducting regions 32 fill the trenches 24 as illustrated, however, they are then chemically/mechanically planarized using the top of the second gate insulating layer 16 as a "planarizing/etch stop", as illustrated by FIG. 3H. As described more fully hereinbelow, one or more active regions of an electronic device such as an FET can be formed in the semiconducting regions 32. These active regions will be electrically isolated from the substrate 10 by the trench insulating layers 30.

Referring again to FIG. 3G, in-situ doping using phosphine as an N-type dopant gas in the epi reactor can also be performed simultaneously with the growing step to form N-type semiconducting regions 32. The concentration of the dopant gas can also be increased during the growing step so that relatively lightly doped N-type regions extend adjacent the mesa 25 and more highly doped N-type regions extend adjacent an upper surface of the semiconducting regions 32.

Figure 3I:
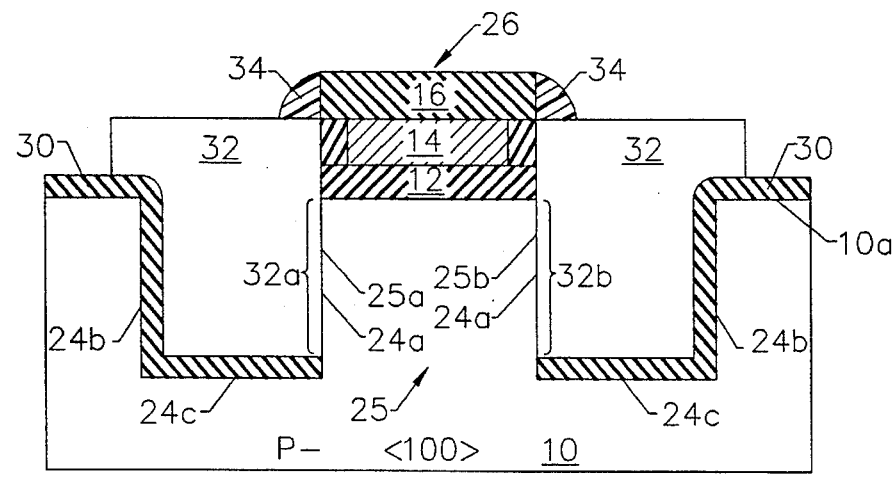
Figure 3J:
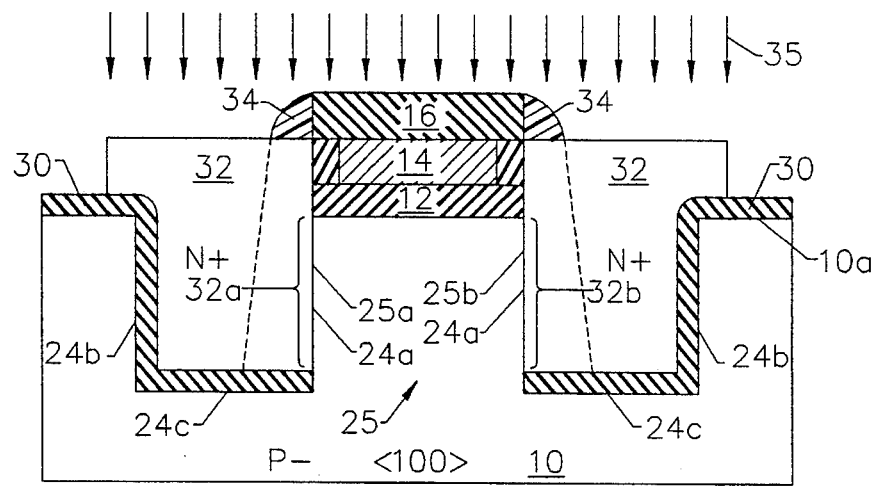
Figure 3K:
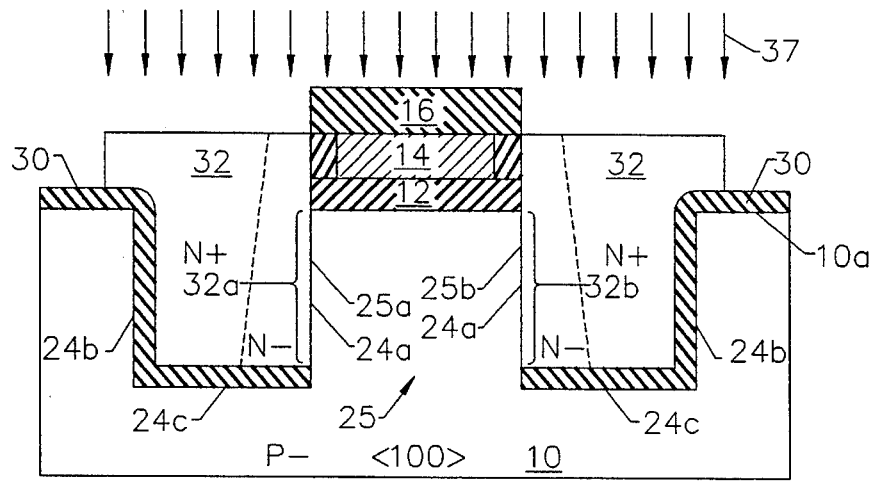

Referring now to FIGS. 3I–3J, the semiconducting regions 32 can alternatively be doped after the growing step has been completed. For example, the semiconducting regions 32 can be etched back using a blanket RIE etching step and then sidewall spacers 34, such as $Si_3N_4$, can be formed adjacent the second gate insulating layer 16. At this stage, a heavy dose blanket arsenic or phosphorus N+ implant 35 can be used to highly dope the semiconducting regions 32 (shown as N+) away from the windows 32a–b, as illustrated by the dotted lines of FIG. 3J. The sidewall spacers 34 can then be removed and a corresponding light dose blanket N-type implant 37 can be performed to lightly dope the semiconducting regions 32 (shown as N-) adjacent the windows 32a–b, as illustrated by FIG. 3K.

Figure 3L:
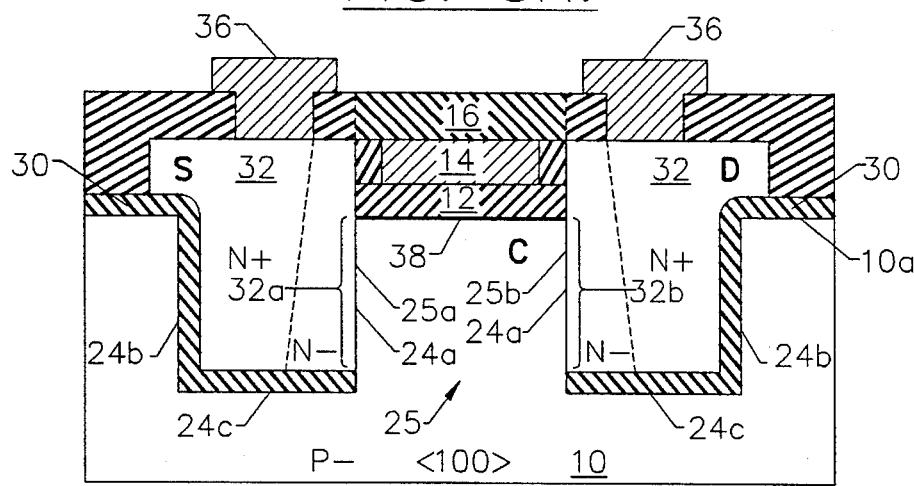

Finally, dopant anneal, oxidation and contact metallization steps are performed to form an enhancement-mode NMOS transistor, as illustrated by FIG. 3L, wherein first, second and third monocrystalline semiconducting regions extend in the substrate 0 and in the adjacent trenches 24, respectively. These three semiconducting regions include the channel region (C) (shown as P-), and the source (S) and drain (D) regions (shown as N-/N+) of the NMOS transistor. As illustrated, vertically displaced source and drain ohmic contacts 36 are provided on the source and drain regions, adjacent the highly doped portions thereof (shown as N+). As understood by those skilled in the art, the application of a sufficiently positive bias to gate electrode 4 will cause the formation of an N-type inversion-layer channel 38 in the channel region (C), which electrically connects the source (S) to the drain (D). However, the channel region (C) is not electrically isolated from the bulk portion of the substrate 10 like conventional SOI FETs. Accordingly, the NMOS FET of FIG. 3L has reduced susceptibility to floating body effects and parasitic latch-up.

Figure 1:
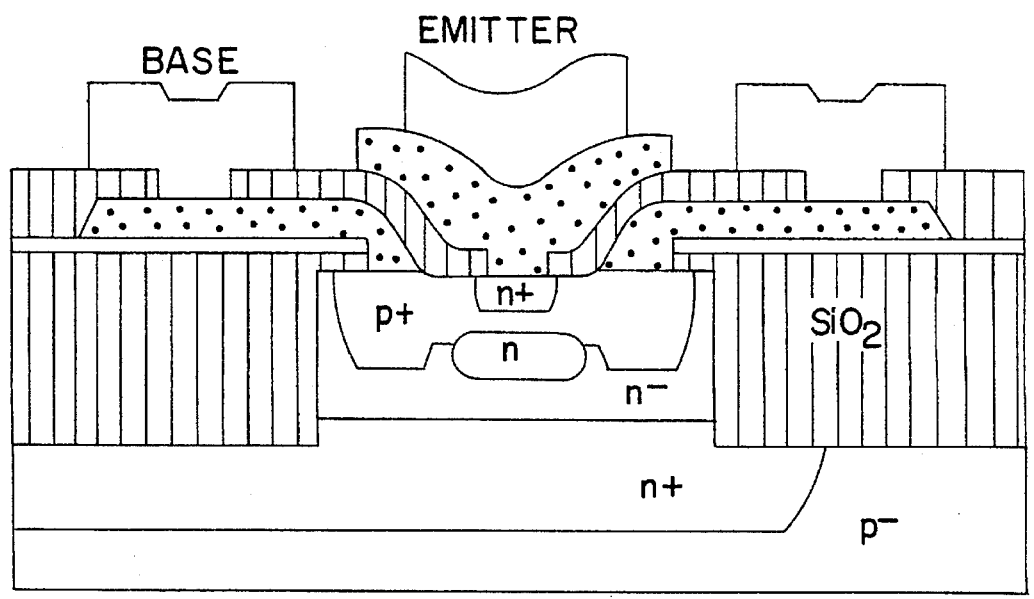
FIG. 1 illustrates a prior art Super Self-Aligned Transistor (SST).
Figure 2:
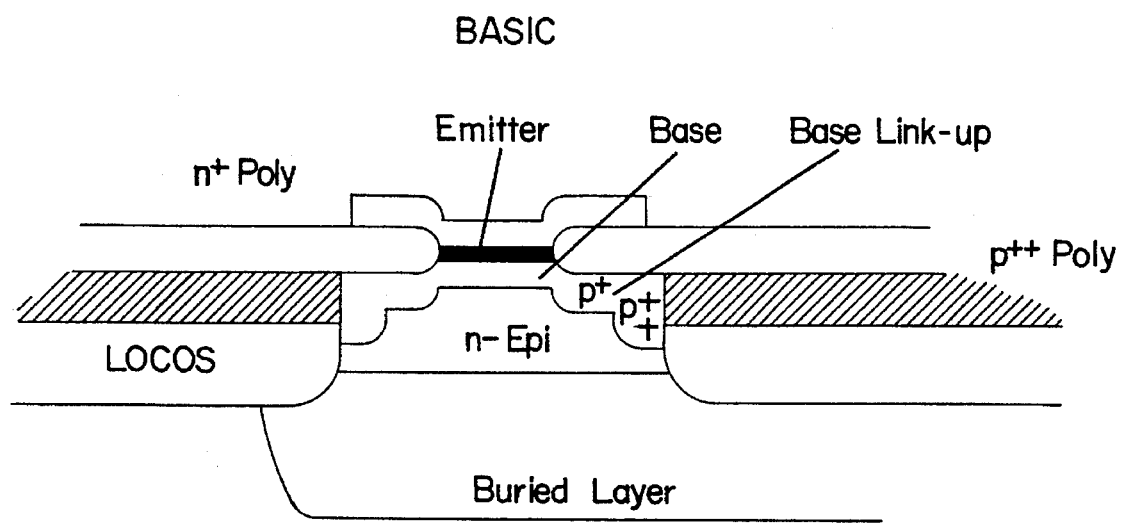
FIG. 2 illustrates a prior art Double Self-Aligned Transistor (DST).

Referring now to FIGS. 4A–4L, a method of forming an electronic device according to a second embodiment of the present invention is illustrated. In particular, FIGS. 4A–4L illustrate the steps of forming a bipolar junction transistor (BJT) which is generally compatible with the steps illustrated and described by FIGS. 3A–3L and the accompanying description. The BJT of the present invention includes, among other things, monocrystalline intrinsic and extrinsic base regions. The present invention eliminates the need for the complex intrinsic-to-extrinsic base link-up regions of the prior art as illustrated by the SICOS DST of FIG. 2. This helps to minimize the base-collector junction area and capacitance and improves the electrical performance of the BJT.

Figure 4A:
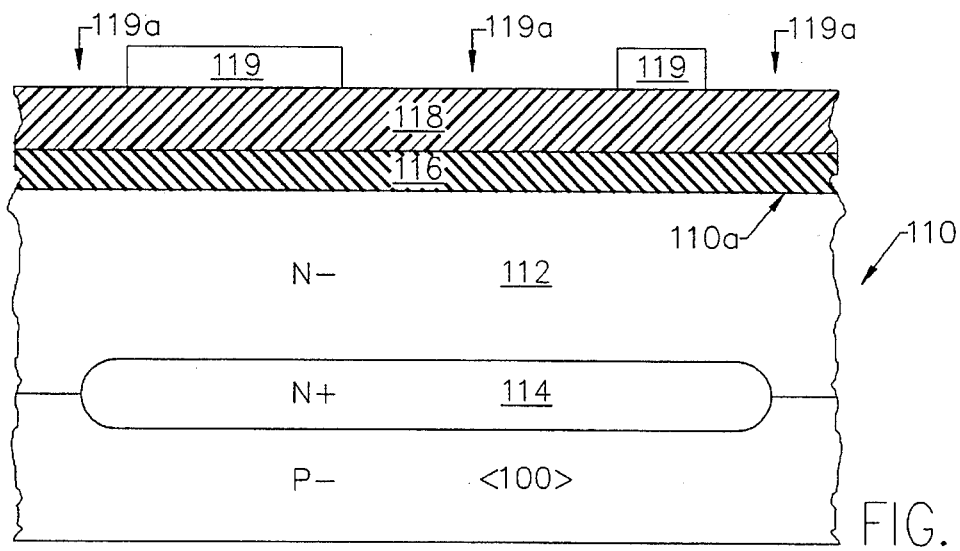
FIGS. 4A–4L are schematic cross-sectional views of intermediate structures illustrating a method of forming an electronic device fabricated according to a second embodiment of the present invention.

Referring specifically to FIG. 4A, an exemplary <100> oriented monocrystalline silicon substrate 110 (shown as P-) is illustrated having a lightly doped epitaxial layer 12 thereon (shown as N-). A relatively highly doped buried layer 114 (shown as N+) is also provided in the substrate 10, as illustrated. A stress relief layer 16 is then formed on the substrate 110, at a face 110a thereof. The stress relief layer 116 is preferably a 900 Å thick layer of grown $SiO_2$. A nitride layer 118 such as $Si_3N_4$ is also preferably formed on the stress relief layer 116 by LPCVD. This is followed by the formation and patterning of a masking layer 119 such as photoresist on the nitride layer 118 using techniques well-known to those skilled in the art. As described more fully hereinbelow, the masking layer 119 is patterned to define an intrinsic collector mesa and an extrinsic collector contact mesa of the aforementioned BJT.

Figure 4B:
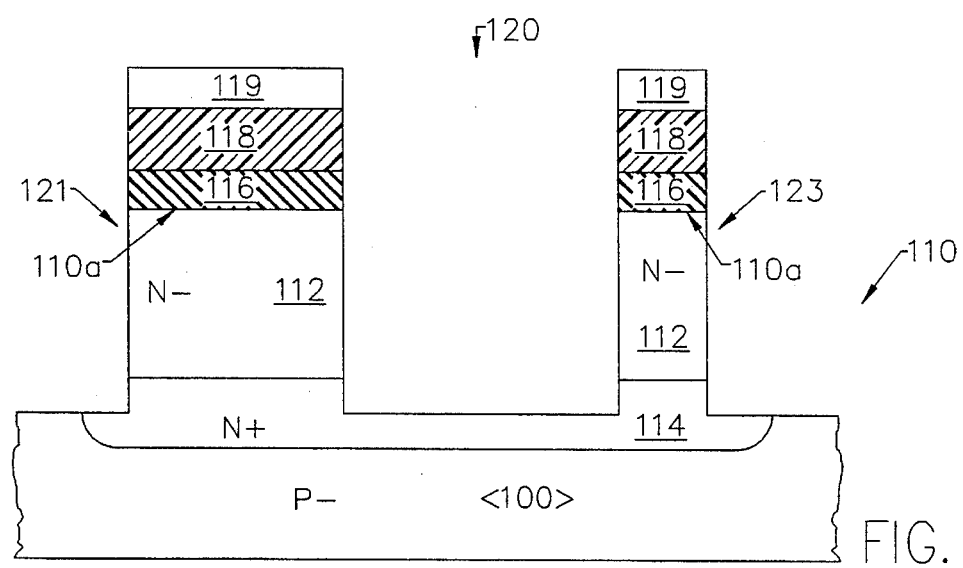

Referring now to FIG. 4B, the nitride layer 118, the stress relief layer 116 and the epitaxial layer 112 are then anisotropically etched in the exposed ares 119a. In particular, dry etching with $SF_6$ is preferably performed to remove the nitride layer 118 in the exposed areas 119a and then Freon 115 is used to remove the stress relief layer 116 and the epitaxial layer 112. These steps define a plurality of adjacent trenches in the substrate and particularly a first trench 120 which extends between the N+ buried layer 114 and the face 1108. The adjacent trenches also define the intrinsic collector mesa 121 and the collector contact mesa 123 which extend in a third dimension orthogonal to the illustrated cross-section. As understood by those skilled in the art, the intrinsic collector mesa 121 may be of cylindrical, rectangular, stripe or similar geometry. For example, the illustrated trenches on either side of the intrinsic collector mesa 121 may extend parallel to each other or be part of a single surrounding trench.

Figure 4C:
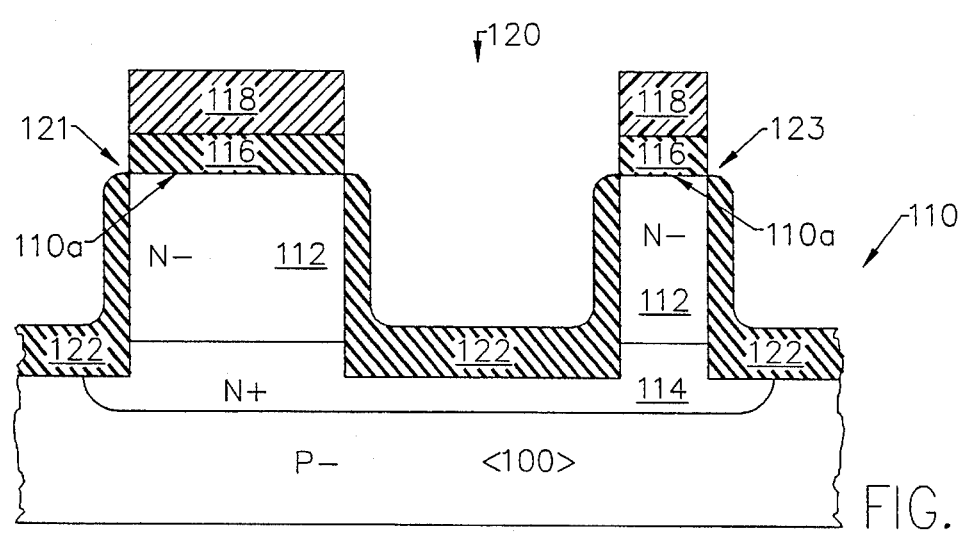
Figure 4D:
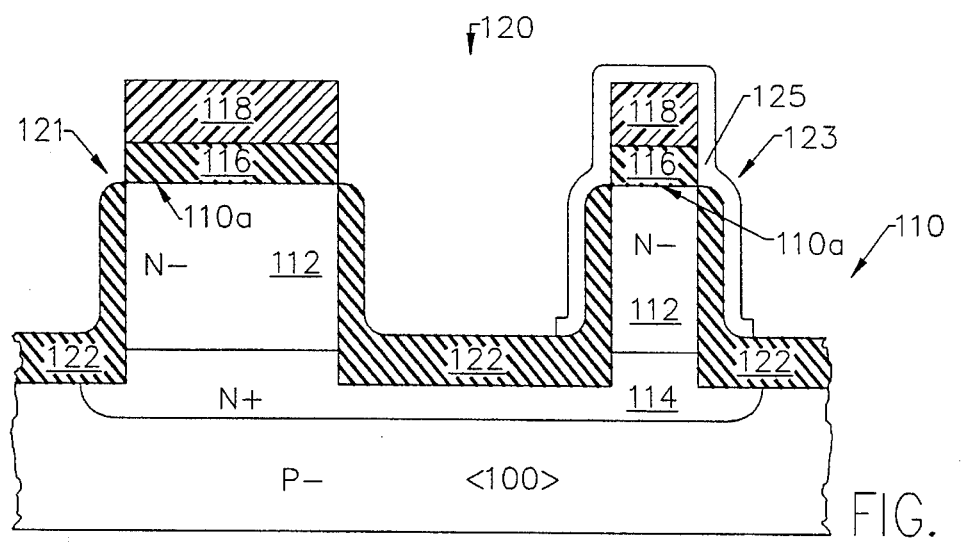
Figure 4E:
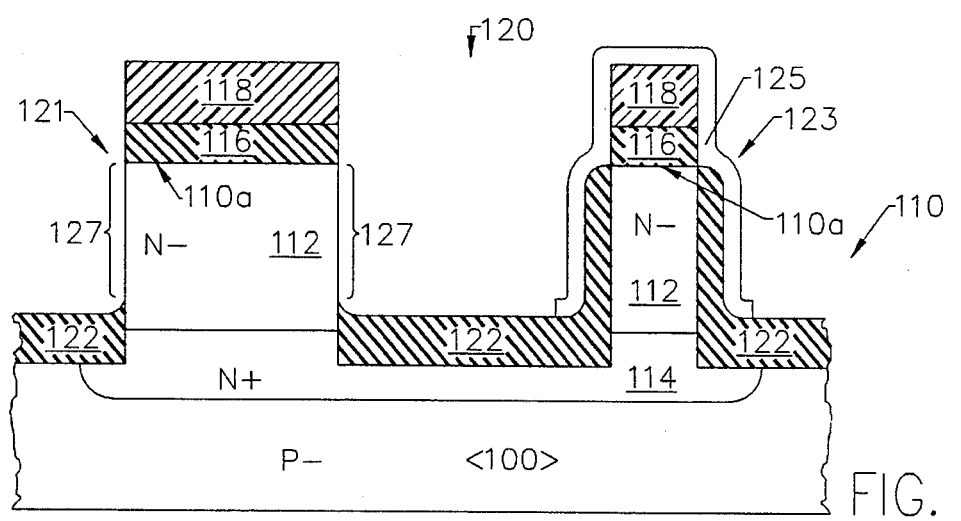

Referring now to FIG. 4C, the masking layer 119 is removed and then trench insulating layers 122 such as $SiO_2$ are formed at the bottoms and along the sidewalls of the adjacent trenches. As illustrated, relatively thick $SiO_2$ is formed adjacent the bottoms of the trenches and relatively thin $SiO_2$ is formed adjacent the sidewalls of the trenches. This can be achieved by taking advantage of the enhanced oxidation rate of the N+ buried layer 114 relative to the N-spitaxial layer 112. Alternatively, nitride spacers (not shown) can be formed adjacent sidewalls of the trenches to inhibit $SiO_2$ growth as described above with reference to FIG. 3E. A non-critical lithographic step using photoresist as a mask 125 is then preferably performed to protect the $SiO_2$ on the sidewalls of the collector contact mesa 123, as illustrated by FIG. 4D. A solution of BHF is then preferably used to etch the insulating layers 122 on the sidewalls of the intrinsic collector mesa 121, but still leave sufficient insulation on the bottoms of the trenches, as illustrated by FIG. 4E. The insulation on the bottoms of the trenches acts to electrically isolate the trenches from the N+ buried layer 114 and the P-substrate 110, as described more fully below. The photoresist mask 125 is then removed.

Figure 4F:
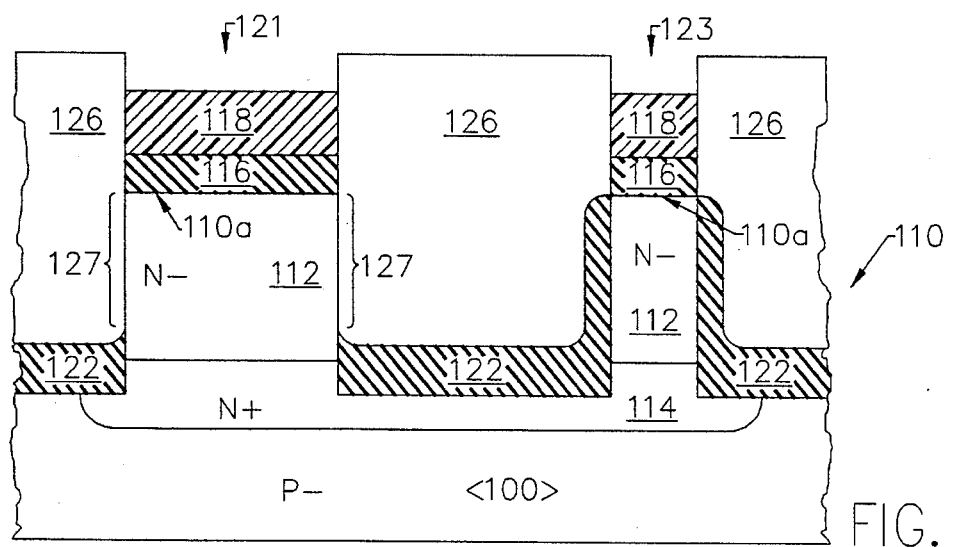
Figure 4G:
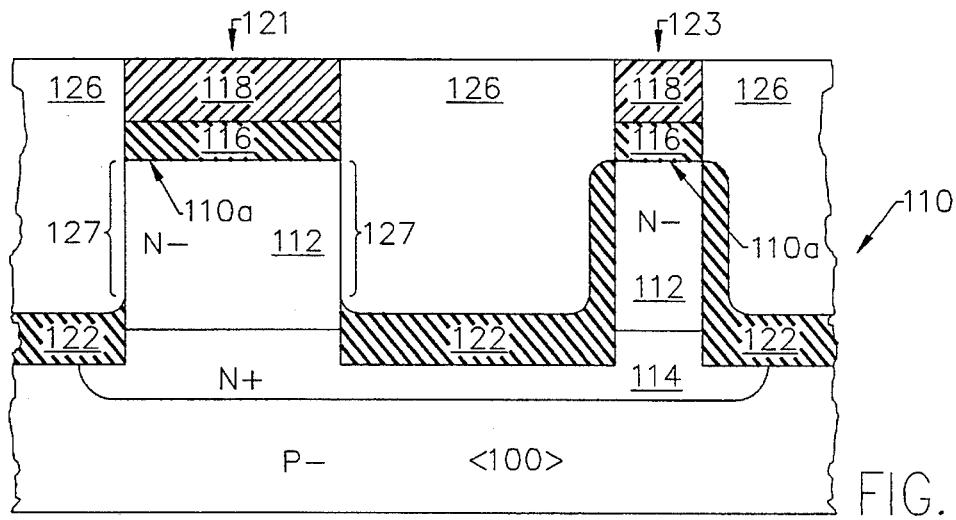

Referring now to FIGS. 4F–4G, a plurality of monocrystalline silicon layers 126 are then formed from the uppermost and exposed portions of the sidewalls (shown as 127) of the intrinsic collector mesa 11 onto the trench insulating layers 122. Preferably, this step includes the step of growing monocrystalline silicon from the windows 127 using vertically-seeded epitaxial lateral overgrowth (VELO). This can be done by placing the structure of FIG. 4E in a LPCVD epi growth reactor (not shown) and then growing monocrystalline epitaxial silicon from the windows 127. The monocrystalline silicon layers 126 fill the trenches as illustrated. The semiconducting regions 126 are then chemically/mechanically planarized using the nitride layers 118 as a planarizing/etch stop, as illustrated by FIG. 4G.

Figure 4H:
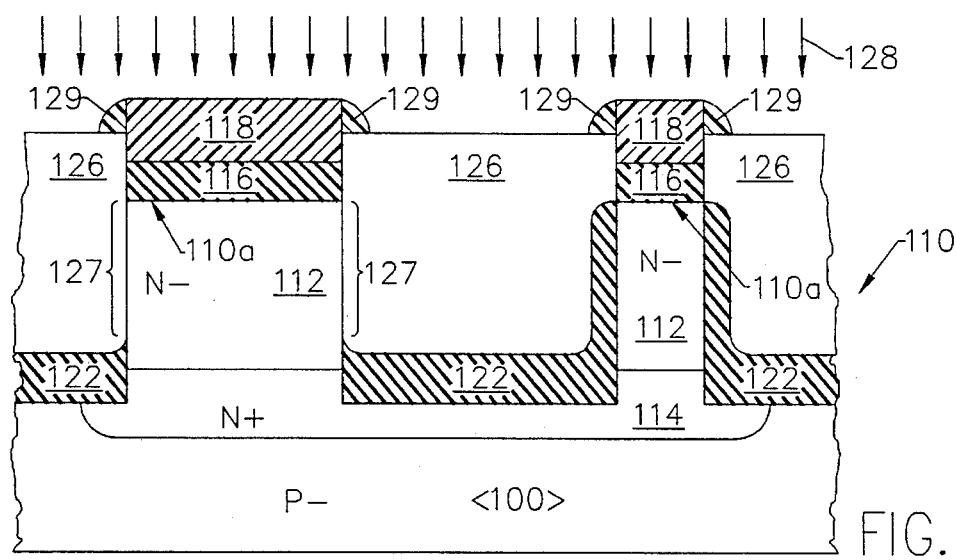

Referring now to FIG. 4H, a heavy dose, blanket P+ implant 128 such as boron (B) is then used to dope the monocrystalline silicon layers 126 to form P+ monocrystalline extrinsic base regions 143, while the intrinsic collector mesa 121 and the extrinsic collector contact mesa 123 are protected by the self-aligned nitride layers 118 thereon. To prevent boron diffusion into the intrinsic collector mesa 121, the implant 128 can be spaced away from the sidewalls of the mesa 121 using nitride spacers 129. This can be achieved by performing blanket RIE to etch back the monocrystalline silicon layers 126 and then forming nitride spacers 129 adjacent the sidewalls of the intrinsic collector mesa 121.

Figure 4I:
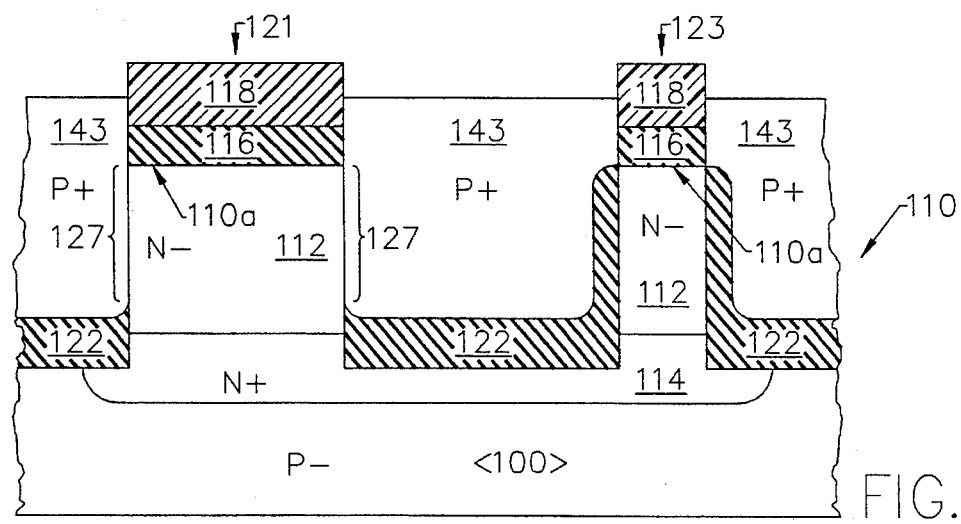
Figure 4J:
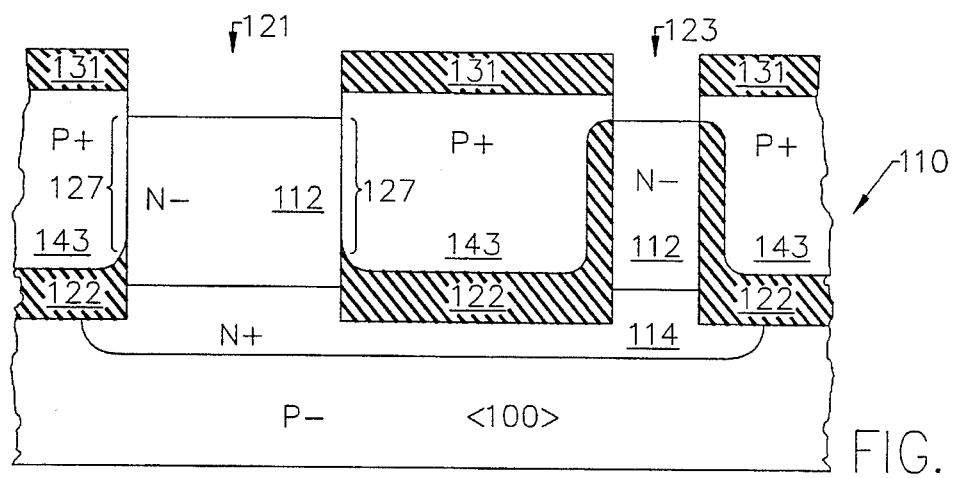

Referring now to FIGS. 4I–4J, the nitride spacers 129 are then stripped and then a protective layer 131, such as a 3000 Å $SiO_2$ layer, is formed (e.g., grown) over the semiconducting regions 126. This protective layer forming step is then followed by the steps of stripping the nitride layers 118, preferably using hot phosphoric acid, and then etching the underlying stress relief $SiO_2$ layers 116 with BHF, as illustrated by FIG. 4J.

Figure 4K:
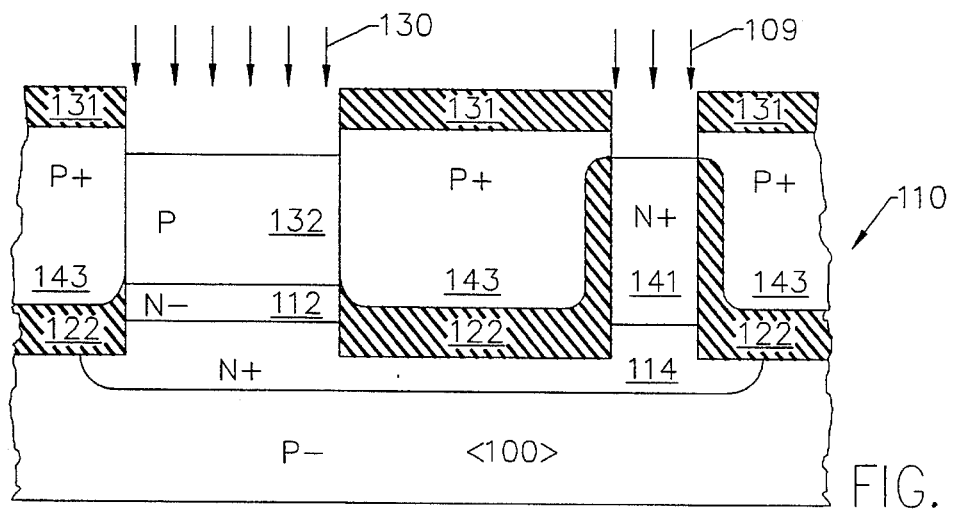
Figure 4L:
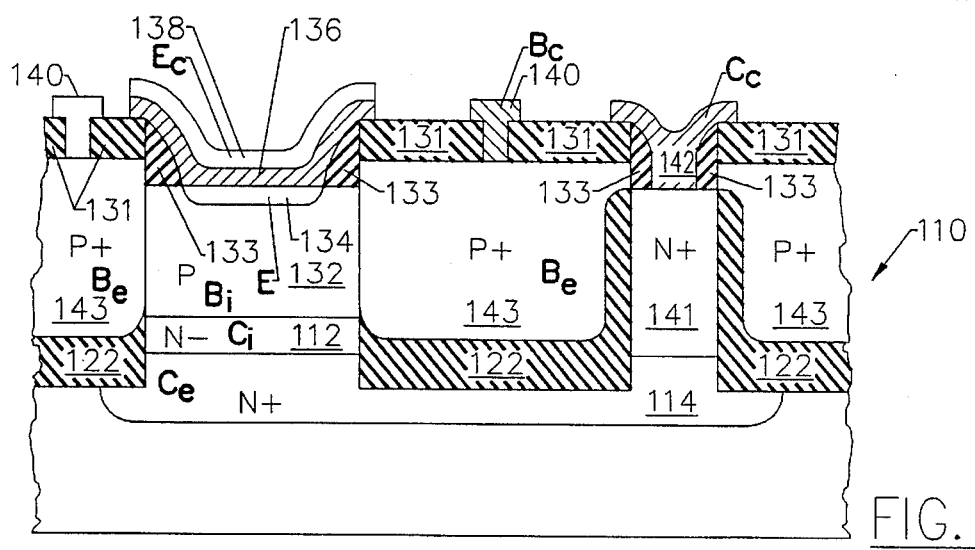

Referring now to FIG. 4K, a P-type dopant implant 30 step and drive-in step are then performed to form a P-type intrinsic base region 132 in the intrinsic collector mesa 121. An N-type dopant implant 109 step and drive-in step are also performed to define an N+ extrinsic collector contact region 141 in the collector contact mesa 123. These steps are then followed by the steps of forming polysilicon sidewall spacers 133 (which are oxidized) on the intrinsic base region 132 and then forming a self-aligned N-type polysilicon emitter layer 136 and N-type emitter region 134 in the opening defined by the insulating spacers 133, as illustrated by FIG. 4L. An ohmic emitter contact 138 ($E_c$), base contact 140 ($B_c$) and collector contact 142 ($C_s$) are then formed on the polysilicon emitter layer 136, monocrystalline extrinsic base region 143 and the monocrystalline extrinsic collector contact region 141, respectively.

Accordingly, the preferred BJT according to the present invention includes: a monocrystalline extrinsic collector ($C_e$) (regions 114, 141); a monocrystalline intrinsic collector region ($C_i$) (region 112); a monocrystalline intrinsic base region ($B_i$) (region 132); a monocrystalline extrinsic base region ($B_e$) (region 143) on a trench insulating layer 122; and monocrystalline emitter region (E) (region 134).

It will be understood by those skilled in the art that electronic devices other than the NMOS and BJT embodiments of FIGS. 3L and 4L can be formed in accordance with the present invention. Such electronic devices include those having at least one trench-isolated active region therein formed by growing monocrystalline semiconducting regions from trench sidewalls as described above. Thus, exemplary electronic devices such as those of FIGS. 3L and 4L include: a monocrystalline semiconductor substrate (10, 110); a first monocrystalline semiconducting region (25, 112) of first conductivity type in the semiconductor substrate; a first trench in the substrate (24, 120); a first trench insulating layer (30, 122) at a bottom of the first trench and on a sidewall thereof; a second monocrystalline semiconducting region of second conductivity type (32, 143) on the first trench insulating layer; a first electronic device active region (C, $C_i$) in the first semiconducting region; and a second electronic device active region (S, $B_e$) in the second semiconducting region. The exemplary electronic devices also include a third electronic device active region (D, E) adjacent the first or second electronic device active region. As illustrated by FIG. 3L, the third electronic device active region can be formed in a third monocyrstalline semiconducting region 32 and this layer is preferably formed in a second trench and extends on a second trench insulating layer.

Figure 5M:
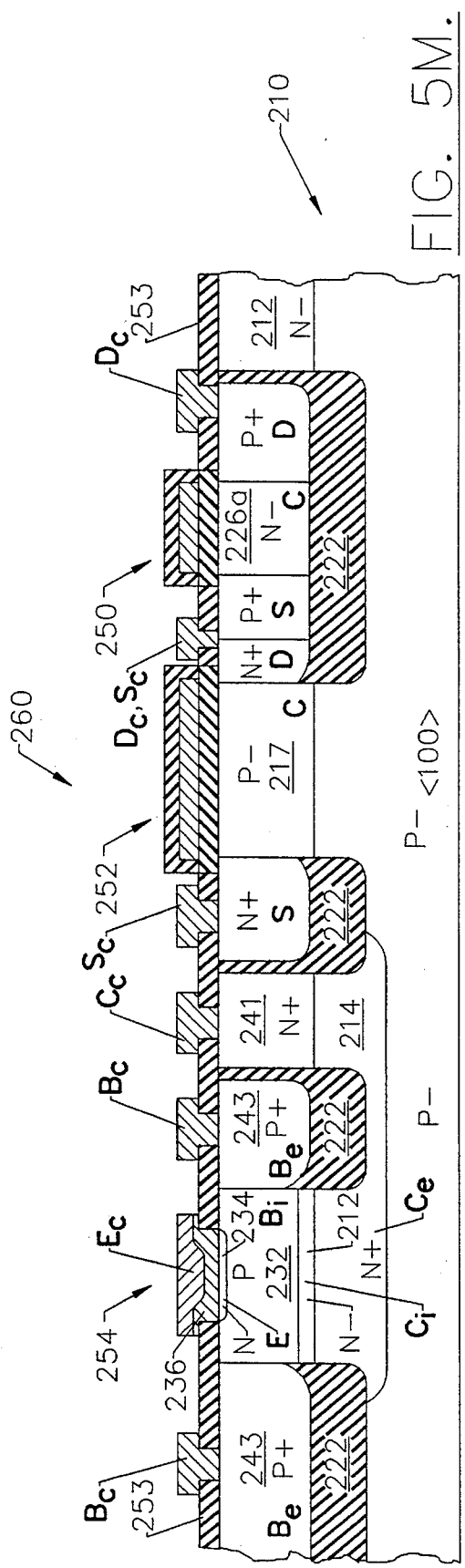

Referring now to FIGS. 5A–5M, a method of forming an electronic device according to a third embodiment of the present invention is illustrated. In particular, FIGS. 5A–5M illustrate the steps of forming a BiCMOS cell which has a bipolar junction transistor (BJT) and complementary N- and P-channel field effect transistors (FETs) therein. These steps are generally compatible with the steps illustrated and described by FIGS. 3A–3L and FIGS. 4A–4L and the accompanying descriptions. Referring specifically to FIG. 5A, an exemplary <100> oriented monocrystalline silicon substrate 20 (shown as P-) is illustrated having a lightly doped epitaxial layer 22 (shown as N-) thereon. A relatively highly doped buried layer 214 (shown as N+) is also provided in the substrate 210, as illustrated. A stress relief layer 216 is then formed on the substrate 210, at a face 210a thereof. The stress relief layer 216 is preferably a 900 Å thick layer of grown $SiO_2$. A nitride layer 218 such as $Si_3N_4$ is also preferably formed on the stress relief layer 216 by LPCVD. The thickness of the nitride layer 218 is preferably 2,000 Å. This is followed by the formation and patterning of a masking layer 219 such as photoresist on the nitride layer 218 using techniques well-known to those skilled in the art. As described more fully hereinbelow, the masking layer 219 is patterned to define an intrinsic collector mesa and an extrinsic collector contact mesa of a BJT and a channel region mesa of an adjacent N-channel field effect transistor.

Referring now to FIG. 5B, the nitride layer 218, the stress relief layer 216 and the epitaxial layer 212 are then anisotropically etched in the exposed ares 219a. In particular, dry etching with $SF_6$ is preferably performed to remove the nitride layer 218 in the exposed areas 219a and then Freon 115 is used to remove the stress relief layer 216 and the epitaxial layer 212. The masking layer 219 is then removed. These steps define a plurality of adjacent trenches 220 in the substrate, as illustrated. The adjacent trenches 220 also define an intrinsic collector mesa 221, a collector contact mesa 223 and a channel region mesa 211 therebetween. The mesas (211, 221 and 223) extend in a third dimension orthogonal to the illustrated cross-section and are preferably of stripe or similar geometry.

In order to selectively form trench insulating layers 222 such as $SiO_2$ which are relatively thick at the bottoms of the trenches 220 but relatively thin along the sidewalls of the trenches, thin spacers 213 are preferably formed adjacent sidewalls of the trenches to inhibit $SiO_2$ growth thereon, as described above with reference to FIG. 3E. These spacers 213 are preferably nitride spacers such as $Si_3N_4$ which have a thickness of about 1000 Å. Referring now to FIG. 5C, wet oxidation of the structure of FIG. 5B is preferably performed to grow the trench insulating layers 222. The thin nitride spacers 213 are also removed by etching with phosphoric acid, however this step is of relatively short duration so that only the top surface of the nitride layer 28 is removed. Then a thin oxide is grown on the sidewalls.

Referring now to FIG. 5D, a non-critical lithographic step using photoresist as a mask 225 is then preferably performed to protect the $SiO_2$ on the sidewalls of the extrinsic collector contact mesa 223 and other regions where sidewall insulation is needed. A solution of BHF is then preferably used to etch back the insulating layers 222 and expose the sidewalls of the intrinsic collector mesa 221 and the channel region mesa 211, but not the bottoms of the trenches 220. As illustrated by FIG. 5E, the photoresist mask 225 is then removed. A plurality of monocrystalline silicon layers 226 are then formed from the uppermost and exposed portions of the sidewalls (shown as windows 227) onto the trench insulating layers 222. Preferably, this step includes the step of growing monocrystalline silicon from the windows 227 using vertically-seeded epitaxial lateral overgrowth (VELO) until the trenches 220 are filled. The semiconducting regions 226 are then chemically/mechanically planarized using the nitride layers 218 as a planarizing/etch stop. A photolithographic step requiring non-critical alignment is then performed to pattern a first implant masking layer 224a on the semiconducting regions 226, as illustrated. A heavy dose, blanket P+ implant 228a such as boron (B) is then used to dope some of the monocrystalline silicon layers 226 and form P+ monocrystalline extrinsic base regions 243 of a bipolar junction transistor therefrom, while the intrinsic collector mesa 221 and the extrinsic collector contact mesa 223 are protected by the self-aligned nitride layers 218.

Another noncritical photolithographic step is then performed to pattern a second implant masking layer 224b on the P+ extrinsic base regions 243, as illustrated by FIG. 5F. Then, a light dose, blanket implant 228b such as phosphorus is performed to dope the remaining monocrystalline silicon layers 226 as N-layers 226a. As illustrated by FIG. 5G, the nitride layers 218 are then stripped preferably in hot phosphoric acid and then the underlying stress relief layers 216 are stripped with BHF to expose the intrinsic collector mesa 221, the extrinsic collector contact mesa 223 and the channel region mesa 211 for further processing. This etching step is then followed by the steps of implanting and driving-in a P-type dopant 228c to form an intrinsic base region 232 in the intrinsic collector mesa 221; implanting and driving-in a high dose N-type dopant 228d to form an N+ extrinsic collector contact region 241 in the collector contact mesa 223; and implanting and driving-in a light dose P-type dopant 228e to form a channel region 217 (shown as P-) in the channel region mesa 211.

Referring now to FIG. 5H, chemical/mechanical planarization of the P+ extrinsic base regions 243 and the N-layers 226a is then performed and followed by the formation of a blanket insulating layer 208 and blanket conductive layer 209 on the substrate 210. The insulating layer 208 is preferably $SiO_2$ formed by conventional deposition or dry oxidation techniques. The thickness of the insulating layer 208 is preferably in the range of about 15 to 50 Å. The conductive layer 209 is preferably poly-Si having a thickness of about 3500 Å and may be deposited using Low Pressure Chemical Vapor Deposition (LPCVD). A masking layer 207 such as photoresist is then formed and patterned as illustrated. The insulating layer 208 and conductive layer 209 are then chemically etched in the exposed areas 207a and this step is preferably followed by the step of oxidizing the top and exposed ends of the etched conductive layer 209 to define first and second insulated gate electrodes 209a–b having surrounding insulating regions 20Sa–b, as illustrated by FIG. 5I.

Referring now to FIGS. 5J–5K, another noncritical photolithographic step is then performed to pattern a third implant masking layer 224c and this is then followed by a P+ implant 228f and drive-in step using a dopant such as boron (B) to define the source (S), drain (D) and channel (C) regions of the PMOS field effect transistor 250. A fourth implant masking layer 224d is then formed and followed by a N+ implant 228g using a dopant such as phosphorus to define source (S), drain (D) and channel (C) regions of the NMOS field effect transistor 252.

As illustrated by FIG. 5L, a surface insulating layer 253 such as $SiO_2$ having a thickness in the range of about 15 to 50 Å is then formed on the exposed portions of the substrate 210. Then, using techniques known to those skilled in the art, openings are made in the surface insulating layer 253 to expose: the extrinsic base region 243, the intrinsic base region 232 and the extrinsic collector contact region 241 of the BJT; and the source (S) and drain (D) regions of the NMOS FET 252 and PMOS FET 250. As described above with respect to FIG. 4L, an N-type polysilicon emitter layer 236 and an N-type emitter region 234 are then defined adjacent the intrinsic base region 232. As illustrated by FIG. 5M, these steps are then followed by a contact metallization step over the openings to define base, emitter and collector contacts ($B_c$, $E_c$, $C_c$) of the BJT 254, and the source and drain contacts ($S_c$, $D_c$) of the NMOS FET 252 and PMOS FET 250.

Accordingly, the BiCMOS cell 260 of the present invention includes a monocrystalline semiconductor substrate 210 having a plurality of trenches 220 at a face 210a thereof and a plurality of trench insulating layers 222 on bottoms of the trenches 220. Monocrystalline semiconducting regions are also included in the trenches and they extend on the trench insulating layers. Each of these semiconducting regions includes at least one active region of the BiCMOS cell 260. In particular, a monocrystalline extrinsic base region 243 ($B_e$) of the cell's BJT 254 extends in one or more of the insulated trenches, as illustrated by FIG. 5M, and a monocrystalline intrinsic base region 232 ($B_i$) extends in the intrinsic collector mesa 221 and adjacent the extrinsic base region 243. The intrinsic collector region ($C_i$) also extends between the intrinsic base region 232 and the extrinsic collector region ($C_e$) which includes the buried layer 214 and the extrinsic collector contact region 241.

The BiCMOS cell 260 also includes a monocrystalline source region (S) of a first field effect transistor (shown as NMOS FET 252) in an adjacent trench and a monocrystalline drain region (D) of the NMOS FET 252 in another adjacent trench. The channel region 217 (C) of the NMOS FET 252 is also provided in the channel region mesa 21, between the source (S) and drain (D). As further illustrated by FIG. 5M, the source (S), drain (D) and channel (C) regions of a second field effect transistor (shown as PMOS FET 250) are also preferably provided in the same trench as the drain (D) of the NMOS FET 252. As will be understood by those skilled in the art, the BJT 254 and the NMOS FET 252 of the BiCMOS cell 260 can comprise the BJT of FIG. 4L and the FET of FIG. 3L and similar semiconductor electronic devices as well.

The drawings and specification disclose typical preferred embodiments of the present invention and, although specific terms are employed, they are used in a generic and descriptive sense only and not for purposes of limitation, the scope of the invention being set forth in the following claims.

That which is claimed:

1. A semiconductor-on-insulator electronic device, comprising:

a monocrystalline semiconductor substrate;

a first monocrystalline semiconducting region of a first conductivity type in said monocrystalline semiconductor substrate;

a first trench in said monocrystalline semiconductor substrate at a face thereof, said first trench having a bottom and first and second opposing sidewalls which extend from the bottom of said first trench to the face of said monocrystalline semiconductor substrate;

a first trench insulating layer on the bottom of said first trench and on the second sidewall of said first trench so that the bottom and the second sidewall of said first trench define an interface between said monocrystalline semiconductor substrate and said first trench insulating layer;

a second epitaxial monocrystalline semiconducting region on said first trench insulating layer, opposite the first trench bottom, said second epitaxial monocrystalline semiconducting region forming a semiconductor junction, selected from the group consisting of rectifying and non-rectifying semiconductor junctions, with said first monocrystalline semiconductor region at the first sidewall of said first trench;

a first electronic device active region in said first monocrystalline semiconducting region; and a second electronic device active region in said second epitaxial monocrystalline semiconducting region.

2. The semiconductor-on-insulator electronic device of claim 1, wherein said second epitaxial monocrystalline semiconducting region forms a P-N junction with said first monocrystalline semiconducting region.

3. The semiconductor-on-insulator electronic device of claim 1, further comprising a third electronic device active region adjacent said second electronic device active region and forming a P-N junction therewith.

4. The semiconductor-on-insulator electronic device of claim 3, wherein said first, second and third electronic device active regions comprise monocrystalline collector, base and emitter regions of a bipolar junction transistor, respectively.

5. The semiconductor-on-insulator electronic device of claim 4, wherein said monocrystalline base region comprises a monocrystalline extrinsic base region on said first trench insulating layer and a monocrystalline intrinsic base region on said monocrystalline collector regions, said monocrystalline extrinsic base region forming a non-rectifying semiconductor junction with said intrinsic base region at the first sidewall of said first trench.

6. The semiconductor-on-insulator electronic device of claim 5, further comprising a base contact on said monocrystalline extrinsic base region and in ohmic contact therewith.

7. The semiconductor-on-insulator electronic device of claim 1, further comprising a third electronic device active region adjacent said first electronic device active region and forming a P-N junction therewith.

8. The semiconductor-on-insulator electronic device of claim 7, wherein said first, second and third electronic device active regions comprise monocrystalline channel, source and drain regions of a field effect transistor, respectively.

9. The semiconductor-on-insulator electronic device of claim 1, further comprising:

a second trench in said monocrystalline semiconductor substrate at the face, said second trench having a bottom and first and second sidewalls which extend from the bottom of said second trench to the face of said monocrystalline semiconductor substrate;

a second trench insulating layer on the bottom of said second trench, so that the bottom of said second trench defines an interface between said monocrystalline semiconductor substrate and said second trench insulating layer;

a third epitaxial monocrystalline semiconducting region on said second trench insulating layer, said third epitaxial monocrystalline semiconducting region forming a semiconductor junction, selected from the group consisting of rectifying and non-rectifying semiconductor junctions, with said first monocrystalline semiconductor region at the first sidewall of said second trench; and a third electronic device active region in said third epitaxial monocrystalline semiconducting region;

wherein said first, second and third electronic device active regions comprise monocrystalline channel, source and drain regions of a field effect transistor.

10. The semiconductor-on-insulator electronic device of claim 1, further comprising:

a second trench in said monocrystalline semiconductor substrate at the face, said second trench having a bottom and first and second sidewalls which extend from the bottom of said second trench to the face of said monocrystalline semiconductor substrate;

a second trench insulating layer on the bottom of said second trench, so that the bottom of said second trench defines an interface between said monocrystalline semiconductor substrate and said second trench insulating layer;

a third epitaxial monocrystalline semiconducting region of a first conductivity type on said second trench insulating layer, said third epitaxial monocrystalline semiconducting region forming a semiconductor junction, selected from the group consisting of rectifying and non-rectifying semiconductor junctions, with said first monocrystalline semiconductor region at the first sidewall of said second trench; and a third electronic device active region in said third epitaxial monocrystalline semiconducting region;

wherein said first and second electronic device active regions comprise monocrystalline collector and base regions of a bipolar junction transistor; and wherein said third electronic device active region comprises a monocrystalline source region of a field effect transistor.

11. The semiconductor-on-insulator electronic device of claim 10, further comprising:

a third trench in said monocrystalline semiconductor substrate at the face;

a third trench insulating layer at a bottom of said third trench;

a fourth epitaxial monocrystalline semiconducting region of a first conductivity type on said third trench insulating layer; and a fourth electronic device active region in said fourth epitaxial monocrystalline semiconducting region;

wherein said fourth electronic device active region comprises a monocrystalline drain region of the field effect transistor.

12. The semiconductor-on-insulator electronic device of claim 11, wherein said third epitaxial monocrystalline semiconducting region and said fourth epitaxial monocrystalline semiconducting region each form a P-N junction with said monocrystalline semiconductor substrate.

13. The semiconductor-on-insulator electronic device of claim 11, wherein said third and fourth electronic device active regions comprise monocrystalline source and drain regions of a first conductivity type channel field effect transistor; and wherein said fourth epitaxial monocrystalline semiconducting region also comprises monocrystalline source and drain regions of a second conductivity type channel field effect transistor on said third trench insulating layer.

14. A semiconductor-on-insulator electronic device, comprising:

a monocrystalline semiconductor substrate having a face thereon;

a buried layer of first conductivity type in said semiconductor substrate;

a first trench in said monocrystalline semiconductor substrate said first trench having first and second opposing sidewalls extending between said buried layer and the face;

a first trench insulating layer at a bottom of said first trench and adjacent the second sidewall thereof;

an epitaxial monocrystalline semiconducting region of a second conductivity type on said first trench insulating layer, said epitaxial monocrystalline semiconducting region forming a semiconductor junction, selected from the group consisting of rectifying and non-rectifying semiconductor junctions, with said monocrystalline semiconductor substrate at the first sidewall of said first trench;

a monocrystalline extrinsic base region of a bipolar junction transistor in said epitaxial monocrystalline semiconducting region;

a monocrystalline intrinsic base region of said bipolar junction transistor in said monocrystalline semiconductor substrate, adjacent said monocrystalline extrinsic base region; and a monocrystalline intrinsic collector region of said bipolar junction transistor in said monocrystalline semiconductor substrate, said monocrystalline intrinsic collector region forming a P-N junction with said monocrystalline intrinsic base region; and wherein said buried layer comprises an extrinsic collector region of said bipolar junction transistor and wherein said first trench insulating layer also extends adjacent a portion of the first sidewall of said first trench to thereby prevent the formation of a P-N junction between said monocrystalline extrinsic base region and said monocrystalline intrinsic collector region.

15. The semiconductor-on-insulator electronic device of claim 14, further comprising:

a monocrystalline emitter region of said bipolar junction transistor adjacent said monocrystalline intrinsic base region and forming a P-N junction therewith; and wherein said monocrystalline intrinsic collector region has a first conductivity type doping concentration less than the doping concentration of said buried layer.

16. The semiconductor-on-insulator electronic device of claim 15, further comprising a base contact on said monocrystalline extrinsic base region and in ohmic contact therewith.

17. A semiconductor-on-insulator BiCMOS cell, comprising:

a monocrystalline semiconductor substrate;

a plurality of adjacent trenches in said monocrystalline semiconductor substrate at a face thereof, said plurality of adjacent trenches each having bottoms and first and second opposing sidewalls;

a plurality of trench insulating layers on respective bottoms and at least portions of the first and second sidewalls of said trenches to thereby form a plurality of insulated trenches;

a monocrystalline extrinsic collector region of a bipolar junction transistor in said monocrystalline semiconductor substrate, said monocrystalline extrinsic collector region extending adjacent the bottom and the second sidewall of first of said insulated trenches;

a monocrystalline intrinsic collector region of said bipolar junction transistor on said monocrystalline extrinsic collector region and extending adjacent the first sidewall of said first insulated trench;

a monocrystalline intrinsic base region of said bipolar junction transistor on said monocrystalline intrinsic collector region and extending adjacent the first sidewall of said first insulated trench;

a monocrystalline extrinsic base region of said bipolar junction transistor in said first insulated trench, said monocrystalline extrinsic base region forming a semiconductor junction with said monocrystalline intrinsic base region at the first sidewall of said first insulated trench, but being electrically insulated from said monocrystalline intrinsic and extrinsic collector regions by the trench insulating layer in said first insulated trench so that conduction of charge carriers from said monocrystalline extrinsic base region to said monocrystalline intrinsic and extrinsic collector regions is prevented but conduction of charge carriers from said monocrystalline intrinsic base region to said monocrystalline intrinsic and extrinsic collector regions is allowed;

a monocrystalline source region of a first enhancement-mode field effect transistor in a second of said insulated trenches; and a monocrystalline drain region of said first enhancement-mode field effect transistor in a third of said insulated trenches.

18. The BiCMOS cell of claim 17, further comprising:

a monocrystalline source region of a second enhancement-mode field effect transistor in said third insulated trench, adjacent said monocrystalline drain region of said first enhancement-mode field effect transistor and forming a P-N junction therewith;

a monocrystalline channel region of said second enhancement-mode field effect transistor in said third insulated trench; and a monocrystalline drain region of said second enhancement-mode field effect transistor in said third insulated trench.

19. The BiCMOS cell of claim 17, further comprising:

a monocrystalline source region of a second enhancement-mode field effect transistor in said third insulated trench; and a monocrystalline drain region of said second enhancement-mode field effect transistor in said third insulated trench.

20. The BiCMOS cell of claim 19, further comprising a monocrystalline channel region of said first enhancement-mode field effect transistor between said second insulated trench and said third insulated trench.

21. The BiCMOS cell of claim 20, wherein said monocrystalline source and drain regions of said first enhancement-mode field effect transistor comprise lightly doped source and lightly doped drain regions adjacent said monocrystalline channel region of said first enhancement-mode field effect transistor, respectively.

22. The BiCMOS cell of claim 20,
wherein said bipolar junction transistor comprises an N-P-N bipolar junction transistor;
wherein said first enhancement-mode field effect transistor comprises an N-channel field effect transistor; and
wherein said second enhancement-mode field effect transistor comprises a P-channel field effect transistor.

23. The BiCMOS cell of claim 22, wherein said source region of said second enhancement-mode field effect transistor and said drain region of said first enhancement-mode field effect transistor form a P-N junction.

24. The BiCMOS cell of claim 19, wherein said monocrystalline source and drain regions of said second enhancement-mode field effect transistor comprise epitaxially overgrown silicon source and drain regions.

25. The BiCMOS cell of claim 19,
wherein said bipolar junction transistor is selected from the group consisting of N-P-N and P-N-P transistors;
wherein said first enhancement-mode field effect transistor comprises a first-channel MOSFET; and
wherein said second enhancement-mode field effect transistor comprises a second-channel MOSFET.

26. A semiconductor-on-insulator field effect transistor, comprising:
a monocrystalline semiconductor substrate of first conductivity type;
first and second adjacent trenches in said semiconductor substrate at a face thereof, said first and second trenches each having trench bottoms and first and second opposing sidewalls;
first and second trench insulating layers on the bottoms of said first and second trenches and on the second sidewalls of said first and second trenches, respectively;
a first epitaxial monocrystalline source region of second conductivity type on said first trench insulating layer, opposite said monocrystalline semiconductor substrate, said first epitaxial monocrystalline source region comprising a three dimensional in-situ doped semiconducting region therein having a uniform second conductivity type doping concentration in at least two orthogonal dimensions thereof;
a second epitaxial monocrystalline drain region of second conductivity type on said second trench insulating layer, opposite said monocrystalline semiconductor substrate, said second epitaxial monocrystalline source region comprising a three dimensional in-situ doped semiconducting region therein having a uniform second conductivity type doping concentration in at least two orthogonal dimensions thereof;
an insulated gate electrode on the face, between said first and second adjacent trenches: and
wherein said monocrystalline semiconductor substrate comprises a channel region of first conductivity type which extends between said source and drain regions and forms respective P-N junctions therewith at the first sidewalls of said first and second trenches.

27. The semiconductor-on-insulator field effect transistor of claim 26, wherein said monocrystalline source and drain regions comprise:
a relatively lightly doped region adjacent said channel region; and
a relatively highly doped region on said relatively lightly doped region, opposite said channel region.

* * * * *